United States Patent
Okada

(10) Patent No.: US 9,176,007 B2
(45) Date of Patent: Nov. 3, 2015

(54) OPTICAL SENSOR INCLUDING LIGHT-RECEIVING ELEMENT HAVING TWO TERMINALS AND ELECTRONICS DEVICE INCLUDING THE OPTICAL SENSOR

(75) Inventor: Norikazu Okada, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 591 days.

(21) Appl. No.: 13/599,583

(22) Filed: Aug. 30, 2012

(65) Prior Publication Data

US 2013/0068926 A1   Mar. 21, 2013

(30) Foreign Application Priority Data

Sep. 21, 2011 (JP) ................................. 2011-206356
Apr. 11, 2012 (JP) ................................. 2012-090514

(51) Int. Cl.
*G01J 1/44* (2006.01)
*H03F 3/08* (2006.01)

(52) U.S. Cl.
CPC .... *G01J 1/44* (2013.01); *H03F 3/08* (2013.01)

(58) Field of Classification Search
CPC combination set(s) only.
See application file for complete search history.

(56) References Cited

U.S. PATENT DOCUMENTS

| 6,144,197 A | 11/2000 | Shimamura et al. |
| 7,714,269 B2 * | 5/2010 | Yoshikawa et al. ....... 250/214 R |
| 2007/0045672 A1 | 3/2007 | Nishi et al. |
| 2007/0257248 A1 | 11/2007 | Arao et al. |
| 2008/0246064 A1 | 10/2008 | Kimura |
| 2009/0121119 A1 | 5/2009 | Nishi et al. |
| 2009/0272878 A1 * | 11/2009 | Suzuki .......................... 250/206 |
| 2011/0062543 A1 | 3/2011 | Nishi et al. |
| 2012/0049185 A1 | 3/2012 | Kimura |

FOREIGN PATENT DOCUMENTS

| JP | 4-77015 | 3/1992 |
| JP | 10-332722 A | 12/1998 |
| JP | 2001-119283 A | 4/2001 |
| JP | 2005-108908 A | 4/2005 |
| JP | 2007/27209 A | 2/2007 |
| JP | 2007-59889 A | 3/2007 |
| JP | 2007-318111 A | 12/2007 |
| JP | 2008-182209 A | 8/2008 |
| JP | 2009-105548 A | 5/2009 |

* cited by examiner

*Primary Examiner* — Francis M Legasse, Jr.
(74) *Attorney, Agent, or Firm* — Birch, Stewart, Kolasch & Birch, LLP

(57) ABSTRACT

When no light enters a photodiode, a second current mirror circuit operates. Consequently, a current that decreases a potential difference between two terminals of a light-receiving element flows into a transistor of the second current mirror circuit and an output of an optical sensor becomes low. Meanwhile, when light enters the photodiode, a transistor of the light-receiving element is turned on and the second current mirror circuit stops operating. Consequently, the current that decreases the potential difference between the two terminals of the light-receiving element is stopped in the transistor of the second current mirror circuit and the output of the optical sensor becomes high. This makes it possible to provide an optical sensor that has a circuit in which an output of a light-receiving element does not depend on a photocurrent and that is capable of operating at a high speed.

19 Claims, 20 Drawing Sheets

WHEN LIGHT IS TURNED ON/OFF

OPTICAL SENSOR INCLUDING LIGHT-RECEIVING ELEMENT HAVING TWO TERMINALS AND ELECTRONICS DEVICE INCLUDING THE OPTICAL SENSOR

This Nonprovisional application claims priority under 35 U.S.C. §119 on Patent Applications No. 2011-206356 filed in Japan on Sep. 21, 2011 and No. 2012-090514 filed in Japan on Apr. 11, 2012, the entire contents of which are hereby incorporated by reference.

TECHNICAL FIELD

The present invention relates to an optical sensor used for detection of an object and detection of a motion speed of an object, in particular, to an optical sensor employing a photo interrupter that requires a light-receiving element having two terminals.

BACKGROUND ART

For detecting a speed of movement of a digital camera lens, a photo interrupter is used. The photo interrupter here employs a light-receiving element having two terminals. Further, as the light-receiving element of the photo interrupter, a phototransistor has conventionally been used.

FIG. 7 shows a configuration of a conventional light-receiving element employing a phototransistor. When light enters this light-receiving element, a current flows between an output detection terminal and GND. This current is a photocurrent amplified hfe times. As a result, a potential difference is produced at an external resistor section. Due to this potential difference, a voltage of the output detection terminal decreases and consequently, light detection becomes possible.

Patent Literature 1 discloses to widen a range of an output voltage by reversal of an application bias voltage in an optical sensor including a light-receiving element having two terminals. Patent Literature 2 discloses a technique for making it possible to detect slight light to intense light by providing a switch in a circuit for amplifying a photocurrent caused by light received, in an optical sensor including a light-receiving element having two terminals. Further, Patent Literature 3 discloses to obtain a semiconductor device capable of detecting a low illuminance in an optical sensor including a light-receiving element having two terminals.

Patent Literature 4 discloses a device for detecting a rotational speed. This device employs an SMR element or an MR element. In this device, a sensor means including a detection element (detecting section) is driven by a constant voltage that is generated in constant voltage generating means. Then, an output of the sensor means is compared with a comparative voltage by comparison means. Further, in the device, a high current value and a low current value of a square wave current are switched by on and off outputs of a comparator in the comparison means. This device detects a physical quantity of a magnetic field. However, this device may be used as an optical sensor having two terminals, by replacing the detection element with a photodiode.

CITATION LIST

Patent Literatures

Patent Literature 1
Japanese Patent Application Publication, Tokukai, No. 2007-318111 (Publication Date: Dec. 6, 2007)
Patent Literature 2
Japanese Patent Application Publication, Tokukai, No. 2007-59889 (Publication Date: Mar. 8, 2007)
Patent Literature 3
Japanese Patent Application Publication, Tokukai, No. 2008-182209 (Publication Date: Aug. 7, 2008)
Patent Literature 4
Japanese Patent Application Publication, Tokukaihei, No. 10-332722 (Publication Date: Dec. 18, 1998)

SUMMARY OF INVENTION

Technical Problem

In a conventional light-receiving element employing a phototransistor as shown in FIG. 7, an output signal current depends on a photocurrent and a response also depends on the photocurrent. Therefore, a photo interpreter like the conventional light-receiving element is not suitable for application to digital cameras whose speed of operation has been increased. Accordingly, there is a demand for a photo interrupter employing a two-terminal phototransistor that is capable of performing a high-speed operation and that does not depend on a photocurrent.

In optical sensors as disclosed in Patent Literatures 1 and 2, a photodiode is provided with an amplifier circuit and by using a switch, switching of each of a power supply and an amplifier is carried out. Thereby, in the optical sensors, dependency on a photocurrent can be suppressed. In Patent Literature 2, the optical sensor is arranged such that: in a case where there is slight light, the amplifier is connected to the photodiode; and in a case where there is intense light, the amplifier is disconnected from the photodiode.

FIG. 8 is a graph illustrating (a) a relation between a photocurrent and an output current in the conventional optical sensor as shown in FIG. 7 (dotted line in FIG. 8) and (b) a relation between a photocurrent and an output current of the optical sensor of Patent Literature 2 (solid line in FIG. 8). As shown in FIG. 8, the optical sensor of Patent Literature 2 may obtain an output current that is at the same level as an output current in a case where there is intense light, by amplifying an output current in a case where there is slight light. However, the optical sensor of Patent Literature 2 is not different from the conventional optical sensor shown in FIG. 7 in that the output current linearly changes depending on input light. In other words, the output current is not constant. Accordingly, a limitation is still present with respect to a response range and an operation range. Accordingly, the optical sensor of Patent Literature 2 cannot completely solve a problem that is caused by dependency of an output current onto input light. Similarly, the optical sensor of Patent Literature 1 cannot solve a problem that is caused by dependency of an output current onto input light.

Each of the optical sensors of Patent Literature 1 to 3 includes a photodiode, a transistor connected in series to the photodiode, and in addition, another transistor. These two transistors form a current mirror circuit. As shown in FIG. 9, an equivalent circuit of a photo interrupter is configured by a photodiode 101 and a transistor 102, and additionally provided with a transistor 103. The transistors 102 and 103 form a current mirror amplifier.

In a configuration employing an amplifier as in the Patent Literatures 1 to 3, the following disadvantages (A) and (B) may occur.

(A) When light is inputted, a current mirror amplifier operates. This may decrease an output voltage. Consequently, decrease. As a result, in an opposite manner to a state where the current mirror amplifier does not operate, an amplified current may decrease.

(B) Because a voltage phase is opposite, a circuit may oscillate.

The following explains the disadvantages (A) and (B).

In the optical sensor shown in FIG. 9, (1) a photocurrent is produced when light is inputted into the photodiode 101. Then, (2) a gate-source voltage of the transistor 103 is increased. (3) This causes a current mirror current to flow from a source to a drain of the transistor 102. As a result, (4) a current flows from a VCC power supply to an external resistor. Subsequently, (5) an output voltage decreases. (6) This decrease of the output voltage causes a decrease in the gate-source voltage of the transistor 103. Then, (7) the current mirror current that flows in the transistor 102 decreases, and (8) a current flowing in the external resistor decreases. Consequently, (9) the output voltage increases. Next, the step returns to the above (2) and operations of (2) to (9) are repeated.

In the above operation, if a change in potential at the operation (9) is small, the disadvantage (A) occurs. Meanwhile, if a change in voltage at the operation (6) is large, the disadvantage of the (B) above occurs.

Further, in the sensor of Patent Literature 4, it is not possible to decrease a voltage between the two terminals to a sufficiently low level because the sensor includes the constant voltage generating means and the comparison means. The following explains a reason for this.

The comparator of the comparison means that carries out comparison by generating a comparative voltage as described above is configured by a differential amplifier in terms of an electronic circuit. Because at least two transistors constituting the differential amplifier need to be connected in series and each one of the at least two transistors requires approximately 0.7 V as an operation voltage, a voltage of at least approximately 1.4 V is required.

Further, in a case where the comparator is formed within a circuit of the constant voltage generating means, the circuit of the constant voltage generating means needs to be configured to operate at a voltage that is higher than that of the comparator. In this case, the circuit requires a voltage of at least approximately 2.1 V.

Due to such a voltage, a decreased voltage between the two terminals stays high.

Solution to Problem

An object of the present invention is to provide an optical sensor (i) that has a circuit whose output of a light-receiving element does not depend on a photocurrent and whose decreased voltage between two terminals is sufficiently low and (ii) that is capable of operating at a high speed.

An optical sensor of the present invention includes: a light-receiving element having two terminals, the light-receiving element changing, with respect to a fixed potential of one terminal, a potential of the other terminal and thereby detecting a signal; and a current control section on which switching control is carried out by use of a photocurrent that occurs when light is inputted into the light-receiving element, the current control section generating a current that decreases a potential difference between the two terminals, the current being generated when the photocurrent is not produced, the current control section stopping the current when the photocurrent is produced.

According to the above configuration, in a case where no light enters the light-receiving element, the current control section operates and generates the current for decreasing the potential difference between the two terminals. Thereby, an output of the optical sensor becomes low. Meanwhile, in a case where light enters the light-receiving element, the current control section stops operating. Accordingly, the potential difference between the two terminals does not decrease. As a result, the output of the optical sensor becomes high. In this case, the output of the optical sensor needs to be set at a current that is higher than the photocurrent so that the output of the optical sensor depends on the current regulated by the current control section. For example, if the photocurrent is arranged to be in a range up to some µA, the current control section should have a current in a range up to some mA or the like.

Accordingly, the photocurrent is used only for switching control of the current control section. Therefore, the output of the optical sensor does not depend on the photocurrent. Because the output of the optical sensor does not depend on the photocurrent, the output of the optical sensor may take a binary output of a high or low value. Therefore, the optical sensor of the present invention can operate at a high speed.

An electronics device of the present invention includes the optical sensor. Accordingly, a high-performance optical sensor can be provided in the electronics device. Consequently, a function of the electronics device can be improved. Therefore, the present invention is useful.

Advantageous Effects of Invention

An optical sensor including a light-receiving element having two terminals, the light-receiving element changing, with respect to a fixed potential of one terminal, a potential of the other terminal and thereby detecting a signal, the optical sensor includes: a current control section on which switching control is carried out by use of a photocurrent that occurs when light is inputted into the light-receiving element, the current control section generating a current that decreases a potential difference between the two terminals, the current being generated when the photocurrent is not produced, the current control section stopping the current when the photocurrent is produced.

In the configuration, the photocurrent is used only for switching control of the current control section. Accordingly, the output of the optical sensor does not depend on the photocurrent. Because the output of the optical sensor does not depend on the photo current, the output of the optical sensor may take a binary output of a high or low value. Therefore, the optical sensor of the present invention can operate at a high speed.

DESCRIPTION OF EMBODIMENTS

Embodiment 1

Circuit Configuration of Optical Sensor

The following explains in detail one embodiment of the present invention, with reference to a drawing.

Figure 1:
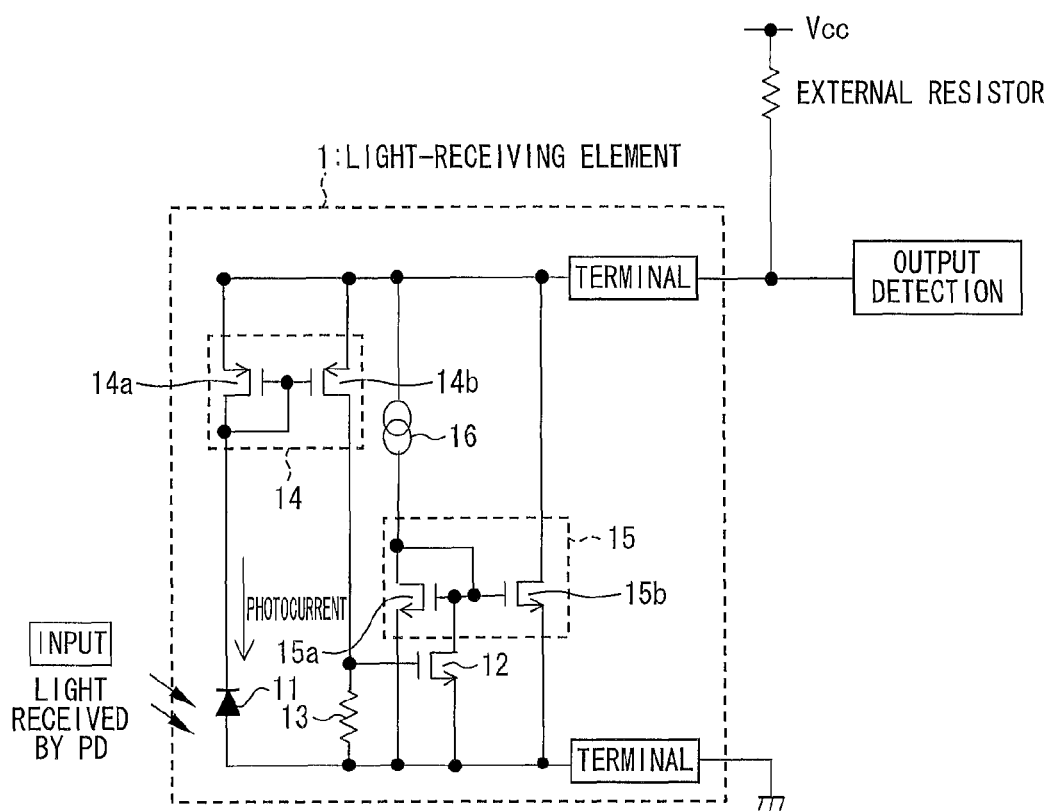
FIG. 1 is a circuit diagram showing a configuration of an optical sensor according to Embodiment 1 of the present invention.

FIG. 1 shows a circuit configuration of an optical sensor according to Embodiment 1. The optical sensor of the present invention includes, in a light-receiving element 1, a phototransistor shown in an equivalent circuit including a photodiode 11 (photoelectric conversion element), a transistor 12, and a resistor 13. The light-receiving element is a two-terminal light-receiving element. The light-receiving element 1 changes, with respect to a fixed potential of one terminal, a potential of the other terminal by changing a circuit current when light is inputted. Thereby, the light-receiving element 1 detects a signal. In the present embodiment, the terminal that has a fixed potential is grounded. Alternatively, a voltage Vcc of a power supply may be arranged to have a fixed voltage. Further, the light-receiving element 1 includes a first current mirror circuit 14 made of transistors 14a and 14b, and a second current mirror circuit (current control section) 15 made of transistors 15a and 15b.

The first current mirror circuit 14 is arranged such that: the transistor 14a on an input side is connected in series to the photodiode 11; and the transistor 14b on an output side is connected in a manner in which a source-drain path is provided between two terminals of the light-receiving element 1. A cathode of the photodiode 11 is connected to the current mirror circuit 14, while an anode of the photodiode 11 is grounded. Further, a drain of the transistor 14b is connected to a gate of the transistor 12, and is also grounded via the resistor 13.

The second current mirror circuit 15 is arranged such that both the transistor 15a on an input side and the transistor 15b on an output side are connected in a manner in which respective source-drain paths are provided between the two terminals of the light-receiving element 1. Further, respective gates of the transistors 15a and 15b are grounded via the transistor 12. Further, a source of the transistor 15a on the input side is connected with a constant current source 16. In addition, in the second current mirror circuit 15, a size of the transistor 15b is designed to be sufficiently larger as compared to a size of the transistor 15a (i.e., 1:100) so that (a current of the first current mirror circuit 14)<(a current of the second current mirror circuit 15).

(Operation of Optical Sensor)

In the optical sensor as shown in FIG. 1, when light enters the photodiode 11 and a photocurrent is generated, the first current mirror circuit 14 operates (as a result of switching control) and a current is generated in the transistor 14b. This current flows into the resistor 13. This current increases VGS (gate-source voltage) of the transistor 12. When a voltage of the transistor 12 reaches a voltage at which the transistor 12 is turned on, VGS in the second current mirror circuit 15 decreases and a current in the second current mirror circuit 15 is turned off (stopped).

By setting (the current of the first current mirror circuit 14)<(the current of the second current mirror circuit 15), an output voltage of the light-receiving element 1 at this time increases. Meanwhile, VGS of the first current mirror circuit 14 does not decrease and a stable current flows in the resistor 13. This state means a normal operation state of the optical sensor (This is because a decrease in VGS of the first current mirror circuit 14 leads to a decrease in current flowing in the resistor 13 and consequently, an operation of the transistor 12 stops).

On the other hand, when no light enters the photodiode 11, the first current mirror circuit 14 does not operate but the second current mirror circuit 15 operates. Because the currents of the first current mirror circuit 14 and the second current mirror circuit 15 are set so that (the current of the first current mirror circuit 14)<(the current of the second current mirror circuit 15), an output voltage of the light-receiving element 1 decreases. However, even when the output voltage of the light-receiving element 1 decreases, the light-receiving element 1 can be stably operated. This is because (VGS of the transistor 15b+a potential difference between both ends of the constant current source 16) may be set so as to be smaller than (VGS of the transistor 12+VDS (drain-source voltage) of the transistor 14b).

Further, the following explains a relation between the photocurrent and the output voltage in the optical sensor. When no light is inputted, a low-level output voltage depends on the current of the second current mirror circuit 15 and the low-level output voltage does not depend on the photocurrent. That is, when no light is inputted, the second current mirror circuit 15 is operating. In the second current mirror circuit 15, the size of the transistor 15b is sufficiently larger than the size of the transistor 15a. Therefore, the current of the second current mirror circuit sufficiently lowers the output voltage of the light-receiving element 1.

Meanwhile, when light is inputted, a high-level output voltage depends on the current of the first current mirror circuit 14. However, by setting the current of the first current mirror circuit 14 to a minute current, a decrease in output voltage of the light-receiving element 1 can be suppressed to the minimum. In this case, by arranging a size of the transistor 12 to be sufficiently small, the second current mirror circuit 15 can be immediately turned off even in a case where the photocurrent is minute. Because the second current mirror circuit 15 is turned off, no current flows in the second current mirror 15. Accordingly, the decrease in the output voltage of the light-receiving element 1 stops because the decrease is caused by the current of the second current mirror circuit 15. Accordingly, even when the photocurrent is small, the output voltage of the light-receiving element 1 increases sufficiently.

Embodiment 2

Circuit Configuration of Optical Sensor

An optical sensor of Embodiment 1 is configured such that a photocurrent is amplified by a second current mirror circuit 15. However, in this configuration, a change in potential of the optical sensor of Embodiment 1 may become insufficient particularly in a case where the photocurrent is small. In a configuration of an optical sensor of Embodiment 2, a photocurrent or an amplified photocurrent is converted to a voltage. When this voltage obtained by the conversion reaches a specified voltage, switching of a transistor is carried out so that the transistor is turned on and driven. Then, a larger constant current may be obtained. This allows stably obtaining a large change in potential of the optical sensor. Therefore, the configuration of the optical sensor of Embodiment 2 is useful.

Figure 2:
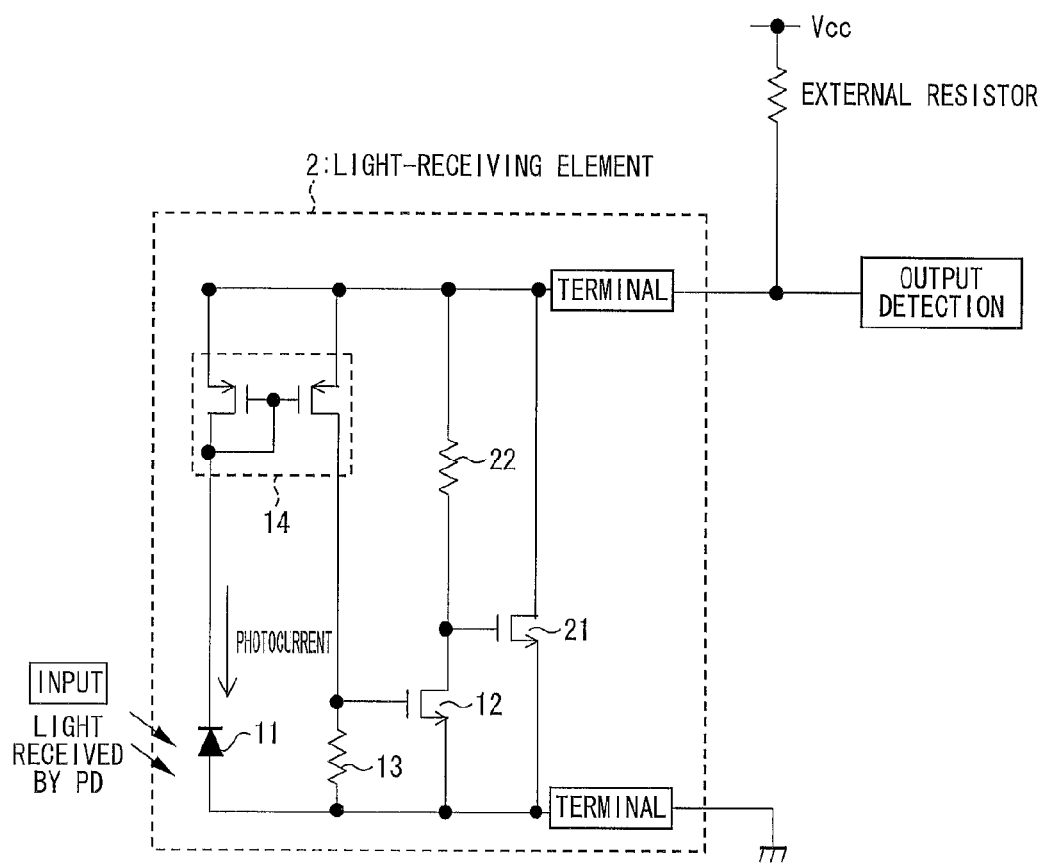
FIG. 2 is a circuit diagram showing a configuration of an optical sensor according to Embodiment 2 of the present invention.

The following explains a circuit configuration of the optical sensor of Embodiment 2, with reference to FIG. 2. The optical sensor of FIG. 2 is configured to include a light-receiving element 2 in place of a light-receiving element 1 of FIG. 1. Members that have identical configurations to those of members in FIG. 1 are respectively provided with the same reference numerals as those of the members in FIG. 1 and detailed explanations thereof are omitted.

The light-receiving element 2 does not include the second current mirror circuit 15 and the constant current source 16 in the light-receiving element 1 and instead, includes a transistor (current control section) 21 and a resistor 22. The transistor 21 is connected so as to have a source-drain path between the two terminals of the light-receiving element 2. A gate of the transistor 21 is connected to a source of the transistor 12. Further, the resistor 22 is connected between the gate of the transistor 21 and an output detection terminal of the light-receiving element 2.

(Operation of Optical Sensor)

As in the optical sensor of FIG. 1, in the optical sensor shown in FIG. 2, when light enters the photodiode 11, a current flows in the resistor 13 and a potential varies. Further, the optical sensor is designed so that, when a photocurrent is equal to or larger than a predetermined transistor 21 is driven. At this time, depending on drive performance of the transistor 21, a larger constant current can be obtained. As a result, a change in potential of the optical sensor becomes stable. Therefore, the configuration of Embodiment 2 is useful. However, note that in the configuration of FIG. 2, it is required that: the resistor 22 has a high resistance value; and a current flowing in the transistor 12 is suppressed. This is for suppressing a decrease in high-level output voltage.

In the optical sensor shown in FIG. 2, in a case where light is inputted, an output becomes a high-level voltage. Meanwhile, in a case where no light is inputted, the output becomes a low-level voltage. In other words, in a case where light is inputted, a minute decrease in voltage occurs due to the photocurrent and a drive current of the transistor 12. Meanwhile, in a case where no light is inputted, an output current of the light-receiving element 2 is determined by a drive current of the transistor 21. Due to a voltage decrease caused by this drive current, the output voltage of the light-receiving element 2 is decreased to a low level. The greater a potential difference between the high level and the low level becomes, the higher performance of detecting the output voltage of the light-receiving element 2 becomes. Accordingly, by setting the drive current of the transistor 21 at a high level, influence of the photocurrent is reduced.

Figure 6:
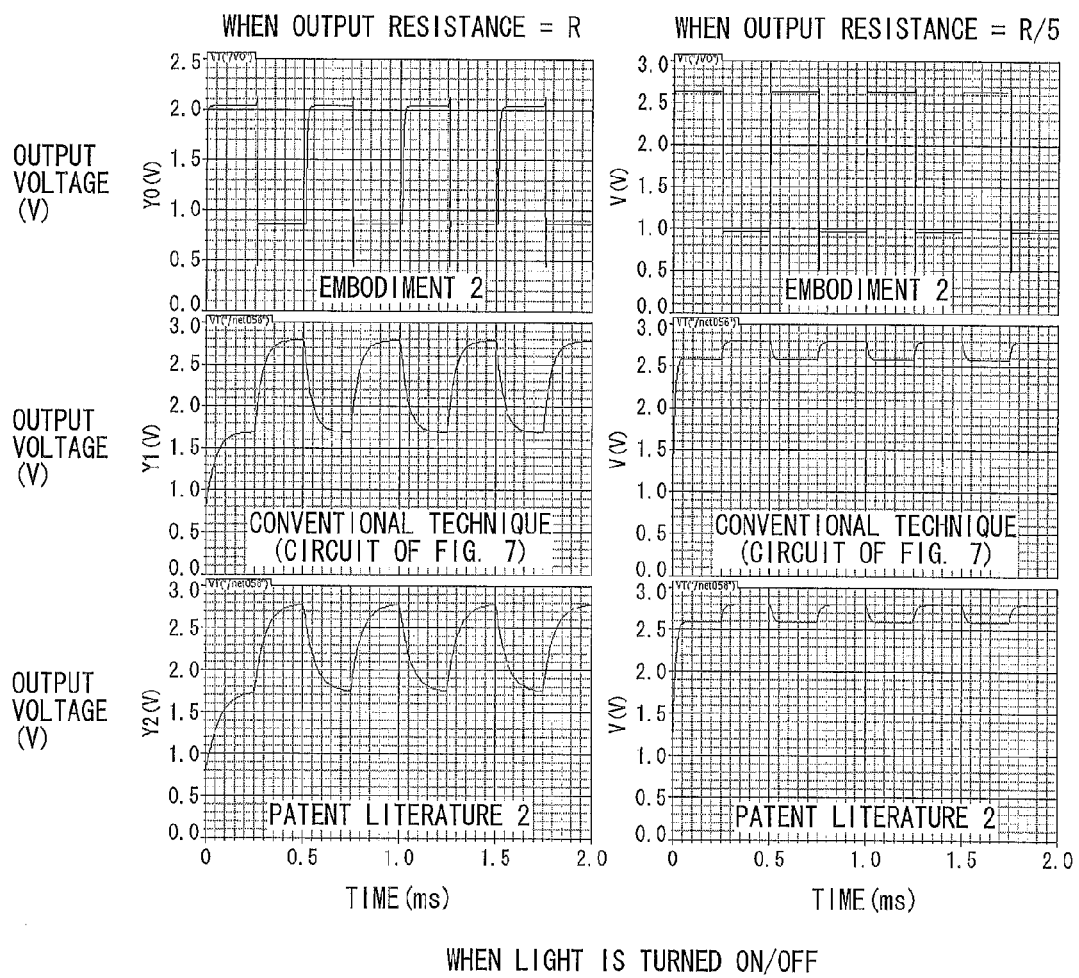
FIG. 6 is a graph showing a result of a simulation of changes in output voltages in a case where input/non-input of light is switched in the optical sensor of Embodiment 2, a conventional optical sensor having a configuration shown in FIG. 7, and a conventional optical sensor as described in Patent Literature 2.
Figure 7:
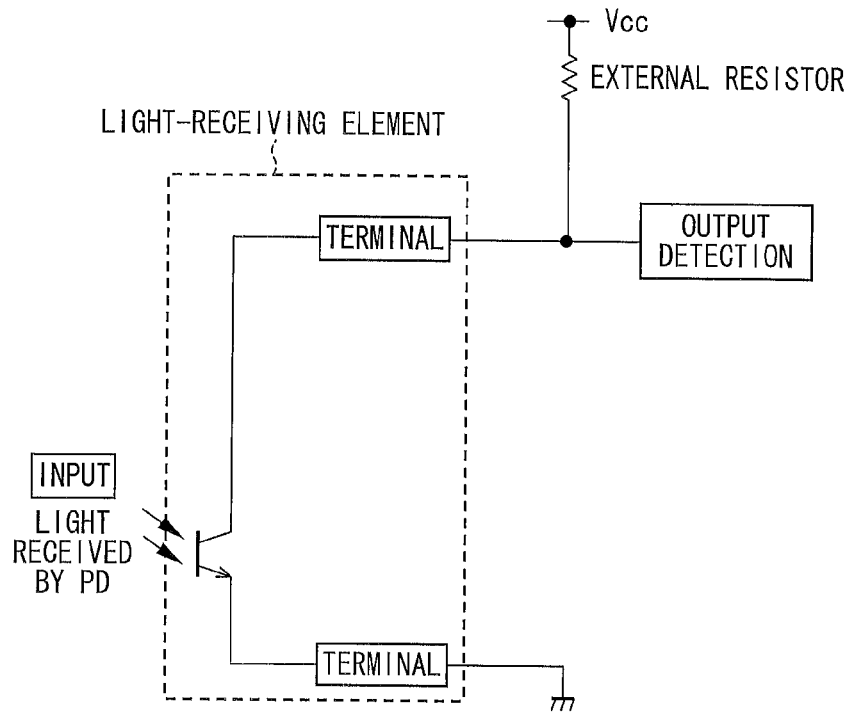
FIG. 7 is a circuit diagram of one exemplary configuration of a conventional optical sensor.
Figure 8:
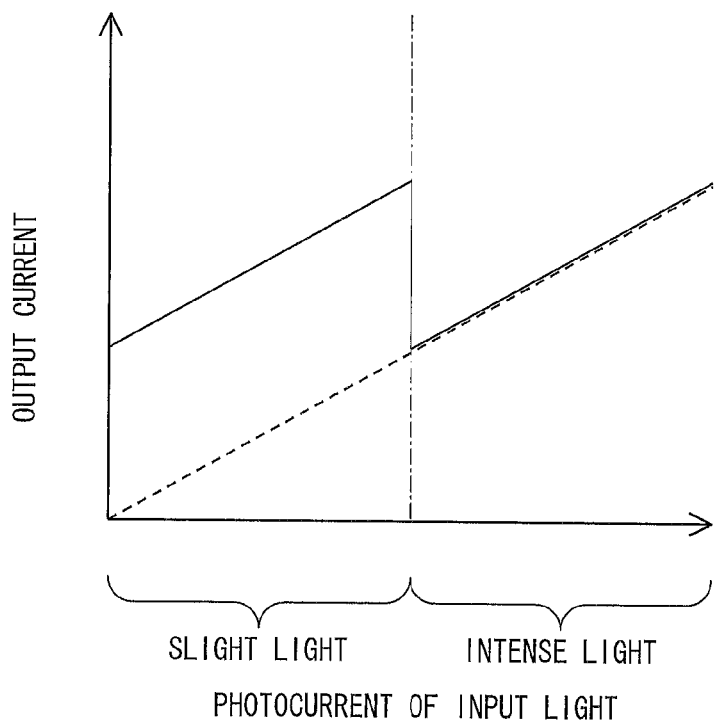
FIG. 8 is a graph showing a relation between a photocurrent and an output current in a conventional optical sensor.
Figure 9:
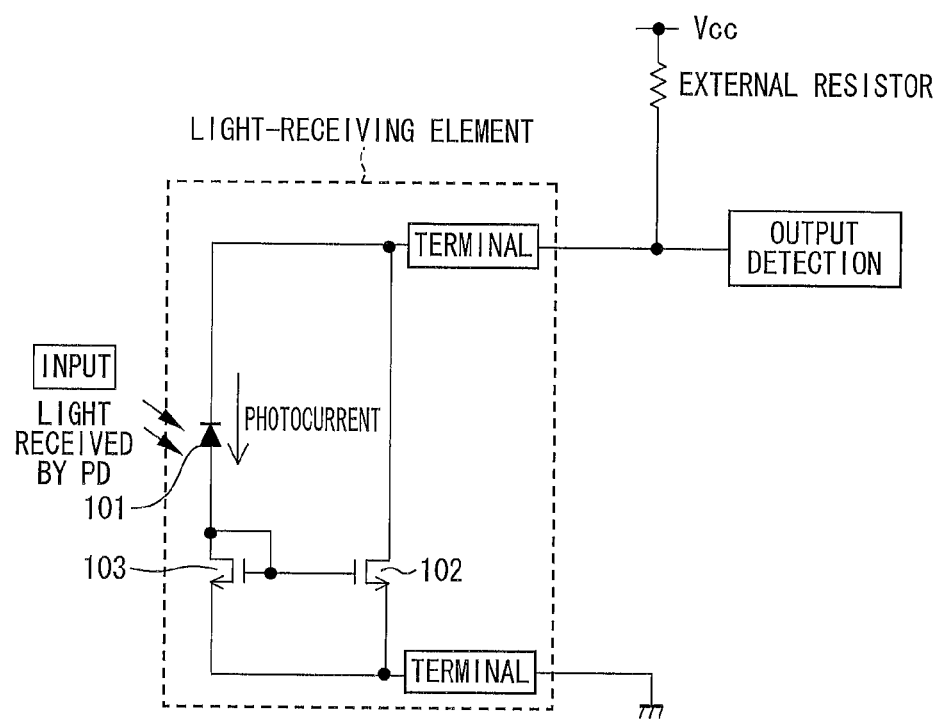
FIG. 9 is a circuit diagram showing another exemplary configuration of a conventional optical sensor.

FIG. 6 shows a result of a simulation of changes in output voltages in a case where input/non-input of light is switched in the optical sensor of Embodiment 2, a conventional optical sensor of a configuration shown in FIG. 7 and a conventional optical sensor disclosed in Patent Literature 2. In the optical sensor of the present embodiment, because an operation range at the low level of the light-receiving element 2 is determined depending on the drive performance of the transistor 21, an operating voltage is less dependent on an external resistor. This is clear from the result of the simulation (In FIG. 6, a low-level voltage is determined by VGS (approximately 1.0 V) of the transistor 21).

Embodiment 3

Circuit Configuration of Optical Sensor

Figure 3:
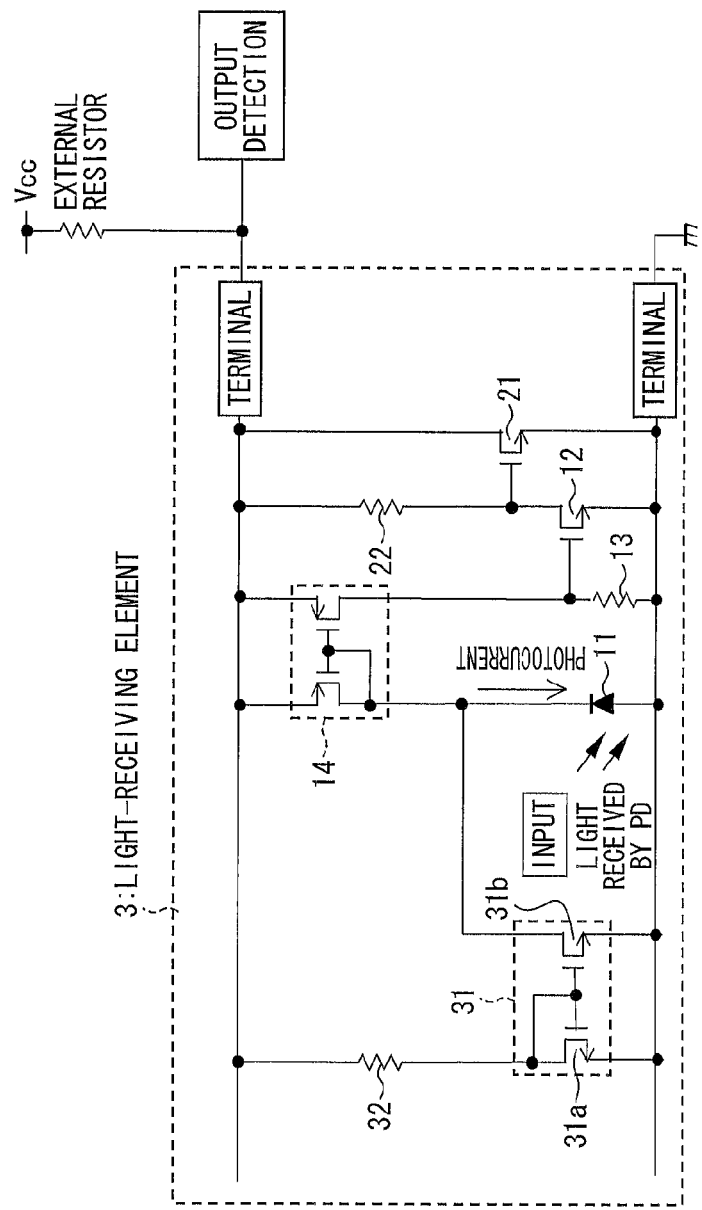
FIG. 3 is a circuit diagram showing a configuration of an optical sensor according to Embodiment 3 of the present invention.

A circuit configuration of an optical sensor of Embodiment 3 is explained with reference to FIG. 3. The optical sensor shown in FIG. 3 is configured to include a light-receiving element 3 in place of a light-receiving element 2 of FIG. 2. Members that have identical configurations to those of members in FIG. 2 are respectively provided with the same reference numerals as those of the members in FIG. 2 and detailed explanations thereof are omitted.

The light-receiving element 3 includes, as a current source provided in parallel to the photodiode 11, a current source including a third current mirror circuit 31 and a resistor 32. A transistor 31a on an input side of the third current mirror circuit 31 is connected to an output detection terminal of the light-receiving element 3 via the resistor 32. A transistor 31b on an output side of the third current mirror circuit 31 causes a current to be inputted into the first current mirror circuit 14 that is an amplifier common to the photodiode 11 and the third current mirror circuit 31.

(Operation of Optical Sensor)

In the light-receiving element 3 shown in FIG. 3, an output current of the current source provided in parallel to the photodiode 11 varies depending on whether or not light is inputted. When light is inputted, a current of the current source increases. Meanwhile, when no light is inputted, the current decreases.

The transistor 12 is turned on when a current flowing in the resistor 13 becomes equal to or larger than a predetermined current. Therefore, in a circuit of the light-receiving element 3, for example, when a current gain of the first current mirror circuit 14 is 1, it is necessary to set I1>I2 where: I1 is a current that flows in the resistor 13 when switching of the transistor 12 is carried out so that the transistor 12 is turned on; and I2 is an output current of the third current mirror circuit 31. The transistor 12 operates when I2+photocurrent≥I1.

In this way, in the light-receiving element 3, the output current of the third current mirror circuit 31 is always supplied to the first current mirror circuit 14. Accordingly, even when no light is inputted, the first current mirror circuit 14 is not completely turned off but is capable of operating. Therefore, the configuration of the present embodiment makes it possible not only to improve photosensitivity but also to improve a speed of an on/off operation in accordance with light input. Therefore, the configuration of the present embodiment is advantageous in that a response speed becomes faster as compared to the light-receiving element 2 of Embodiment 2.

Embodiment 4

Circuit Configuration of Optical Sensor

Figure 4:
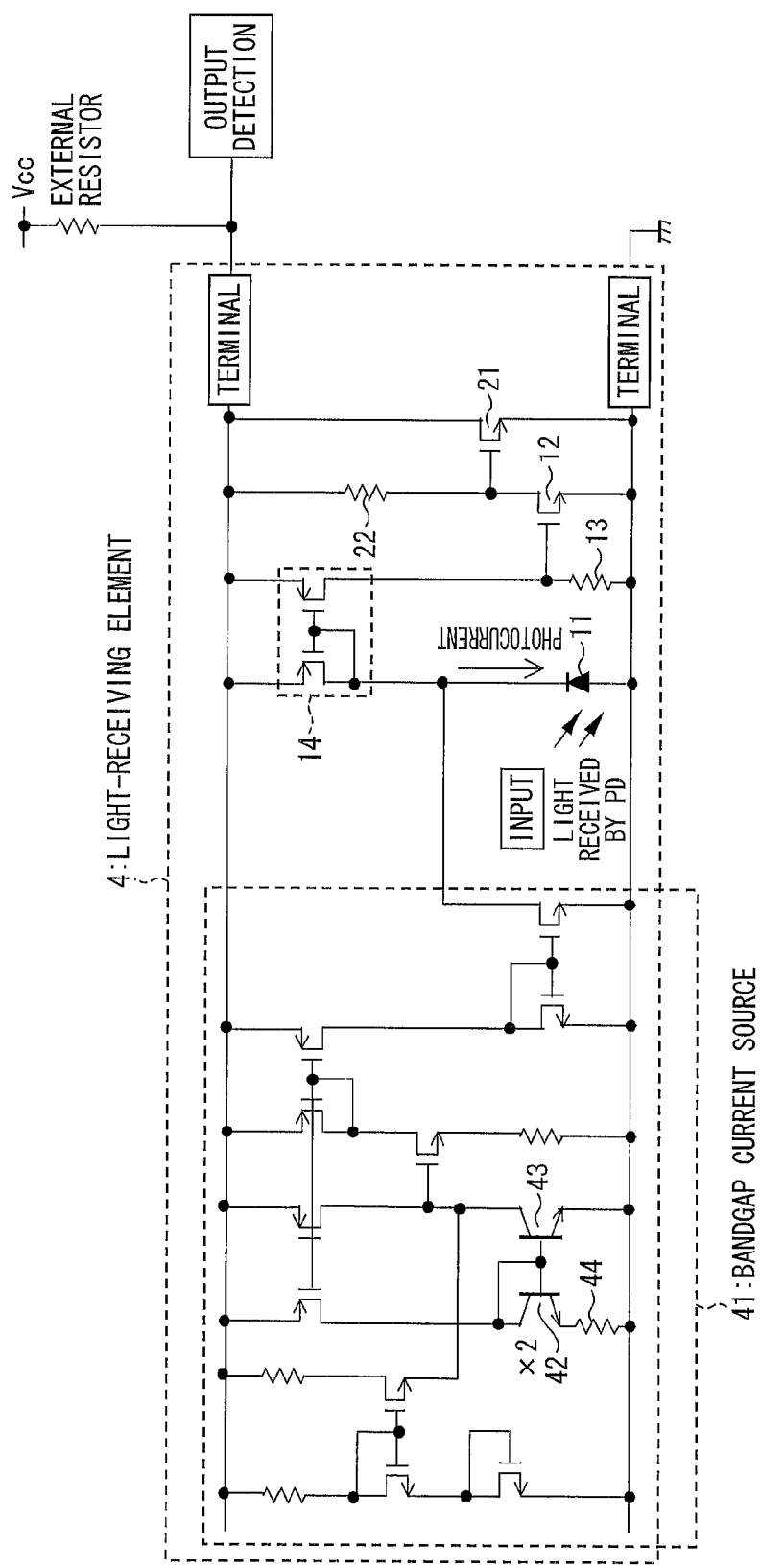
FIG. 4 is a circuit diagram showing a configuration of an optical sensor according to Embodiment 4 of the present invention.

A circuit configuration of an optical sensor of Embodiment 4 is explained with reference to FIG. 4. The optical sensor shown in FIG. 4 is configured to include a light-receiving element 4 in place of a light-receiving element 3 of FIG. 3. Members that have identical configurations to those of members in FIG. 3 are respectively provided with the same reference numerals as those of the members in FIG. 3 and detailed explanations thereof are omitted.

The light-receiving element 4 includes, as a current source provided in parallel to the photodiode 11, a bandgap current source 41 in place of the current source including the third current mirror circuit 31 and the resistor 32 in the light-receiving element 3. The bandgap current source 41 causes a current to be inputted into the first current mirror circuit 14 that is an amplifier common to the photodiode 11 and the bandgap current source 41.

(Operation of Optical Sensor)

In the light-receiving element 3, in a case where a change in current of the current source follows a change in voltage value Vcc of an external power supply, the following case may occur. That is, for example, in a case where a potential is large, a current of the current source may increase and a light detection range may become narrower. Accordingly, it is useful to generate a current that does not depend on a change in potential, with the use of, for example, a bandgap current source. This is because generating such a current makes it possible to stably detect light regardless of a voltage value of the external power supply.

The current of the current source of FIG. 3 changes in accordance with the voltage of the external power supply, in a case where an output detection voltage becomes higher. This may cause a problem such that: when, for example, the voltage of the external power supply is equal to or higher than a predetermined value, the current of the current source increases; and as a result, even though light is not actually detected, a condition of a case where light is detected is produced.

In order to solve the above problem, for example, it is useful to generate a current that does not depend on the external power supply, by using the bandgap current source as shown in FIG. 4. This is because generating such a current suppresses the above problem.

For example, in the case of the bandgap current source 41 as shown in FIG. 4, an expression (VBE42 (=Vt×ln(I44/2Is))+R44×I44=VBE43 (=Vt×ln(I44/Is))) is obtained if a ratio of sizes of the transistor 42 and the transistor 43 is 2 to 1. Therefore, by transforming this expression, Vt×ln 2/R44 is obtained for a reference current (I44) of the current source. In the above expression, VBE42 is a base-emitter voltage of the transistor 42; VBE43 is a base-emitter voltage of the transistor 43; Vt is kT/q (where: q is an electrical charge of an electron; T is a temperature; and k is Boltzmann constant); Is is a saturation current; R44 is a resistance value of the resistor 44. On an assumption that Vt is 26 mV at a normal temperature and R44 is 10 kΩ, a reference current of 1.8 uA is generated. As is clear from the above expression, this current does not include a parameter relevant to the external power supply. Accordingly, it is clear that by using the bandgap current source 41, a current that does not depend on the external power supply can be generated.

Embodiment 5

Figure 5:
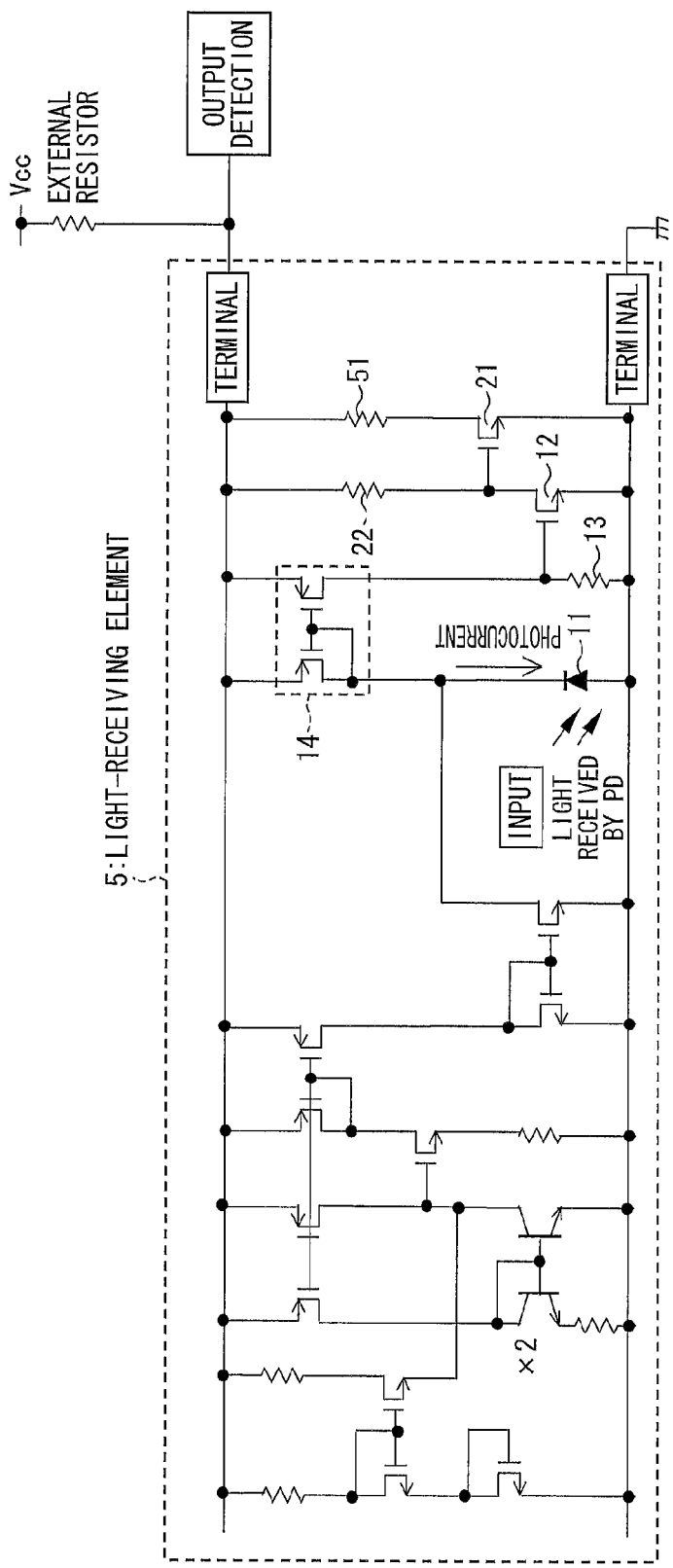
FIG. 5 is a circuit diagram showing a configuration of an optical sensor according to Embodiment 5 of the present invention.

A circuit configuration of an optical sensor of Embodiment 5 is explained with reference to FIG. 5. The optical sensor of FIG. 5 is configured to include a light-receiving element 5 in place of a light-receiving element 4 of FIG. 4. Members that have identical configurations to those of the members in FIG. 4 are respectively provided with the same reference numerals as those of the members in FIG. 4 and detailed explanations thereof are omitted.

The light-receiving element 5 has a configuration in which a resistor 51 is provided between the transistor 21 and an output detection terminal of the light-receiving element 5. This makes it possible to set a minimum value of a variable potential Vcc according to a ratio of resistance values (resistance division) of the external resistor and the resistor 51. This makes it possible to set a voltage that depends on the external resistor and further to obtain a stable voltage. Therefore, the configuration of the present embodiment is useful.

That is, in the light-receiving element 5, the transistor 21 operates when no light is inputted and a voltage of a drain of the transistor 21 is decreased to a value close to 0 V. Accordingly, a low-level output voltage is determined by a ratio of resistances of the external resistor and the resistor 51. The low-level output voltage has a voltage value of Vcc×R51/(R51+resistance of external resistor). Consequently, it becomes possible to set a minimum value of a variable potential.

As described above, the minimum value of the variable potential is determined by a ratio of a resistance of a pull-up resistor in an internal drive circuit with respect to a resistance of a resistor externally provided to the optical sensor. Then, it becomes possible not only to set a voltage that depends on the external resistor but also to obtain a stable voltage. Accordingly, this configuration is useful. The optical sensor of the present embodiment is capable of detecting an operation by using two terminals. Moreover, the optical sensor of the present embodiment can replace a conventional phototransistor as well as being capable of reducing a size of a product. Therefore, the optical sensor of the present embodiment is very effective.

Embodiment 6

Each of optical sensors respectively described in Embodiment 1 to 5 above is preferably provided with a hysteresis characteristic by a resistance value of an external resistor. In an optical sensor of the present embodiment, by a resistance value of an external resistor, a potential varies when an output potential is at a low level. Thereby, a gain of a photoelectric amplifier circuit can be varied. For example, in FIG. 4, when an output potential is at a low level, the bandgap current source 41 approaches an operation limit and an output current decreases. (That is, the output current can be finely regulated by the resistance value of the external resistor.) Accordingly, for changing an output from a low-level state to a high-level state, a large amount of photocurrent (ILH) is required (because ILH+bandgap current=drive current).

Meanwhile, when the output is changed from the high-level state to the low-level state, the bandgap current source 41 is generally operating. Accordingly, an amount of photoelectric current (IHL) necessary for a change to the low-level state is small. A ratio of these ILH and IHL is a hysteresis band (because IHL+bandgap current=drive current). As a result, reversal of the output does not occur even when a change in minute current occurs. As a result, malfunction can be prevented. Therefore, the configuration of the present embodiment is useful.

When an output voltage changes from a high level to a low level or the low level to the high level, noise may come back through wire or the like from an output to an input. This may make the output voltage unstable and may consequently cause a phenomenon (chattering) in which outputs of the high level and the low level are repeated. For preventing this phenomenon, a hysteresis characteristic is provided. By inhibiting the noise from going beyond the hysteresis band even in a case the noise comes back, reversal of the output due to the noise never occurs. In this way, by regulating the hysteresis band by the external resistor, it becomes possible to prevent a problem of chattering caused by an external disturbance.

Embodiment 7

Figure 10:
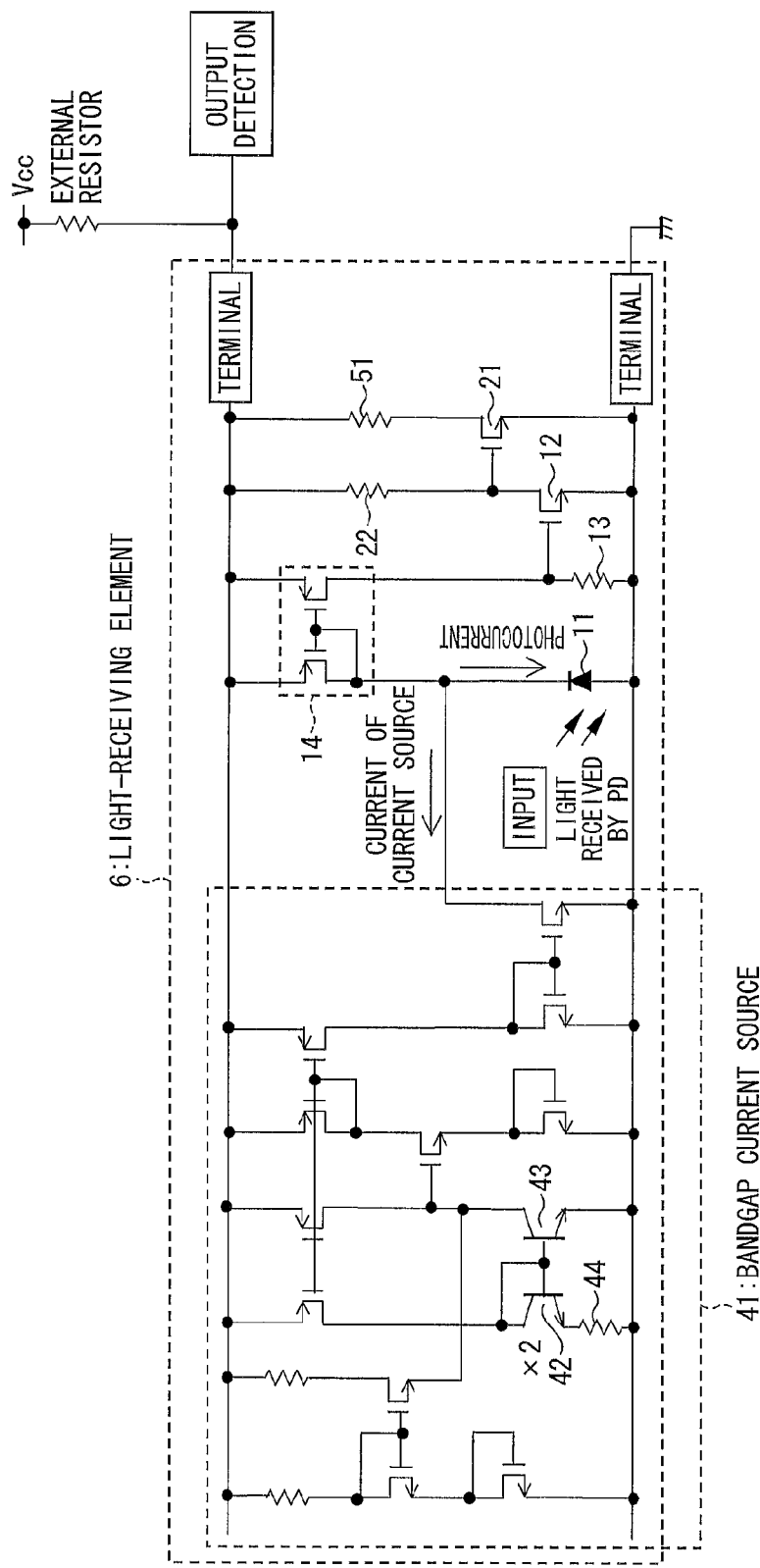
FIG. 10 is a circuit diagram showing a configuration of an optical sensor according to Embodiment 7 of the present invention.

A circuit configuration of an optical sensor of Embodiment 7 is explained with reference to FIG. 10. The optical sensor as shown in FIG. 10 is configured to include a light-receiving element 6 in place of a light-receiving element 5 of FIG. 5. Members that are shown in FIG. 10 and have identical configurations to those of the members in FIG. 5 are respectively provided with the same reference numerals as those of the members in FIG. 5 and detailed explanations thereof are omitted.

In Embodiment 6, the hysteresis band is regulated by the external resistor. Accordingly, the hysteresis band depends on a resistance value of the external resistor. As a result, use of a wider range of the resistance value of the external resistor is limited.

In order to solve the above problem, the light-receiving element 6 is employed for reducing dependency of the hysteresis band onto the resistance value.

As shown in FIG. 10, basically, the light-receiving element 6 is configured in a similar manner to the light-receiving element 5. However, the light-receiving element 6 is different from the light-receiving element 5 in that the hysteresis band is regulated by regulating a current amount of the bandgap current source 41. As described above, the current amount of the bandgap current source 41 is determined by a resistance value of the resistor 44. Therefore, by setting the resistance value of the resistor 44 as appropriate, the current amount is set at a desired value.

For example, with respect to a photocurrent of 10 nA, a current amount of the bandgap current source 41 is arranged to be 2 nA. Further, when a potential difference between the two terminals of the light-receiving element 6 becomes minimum, the bandgap current source 41 is turned off and a current of the bandgap current source 41 becomes 0 A. In such a case, each of the maximum potential difference (Vmax) between the two terminals and the minimum potential difference (Vmin) between the two terminals is proportional to a value obtained by subtracting the current amount of the bandgap current source 41 from a photocurrent. Therefore, a ratio R (hysteresis) of Vmax and Vmin is expressed in the following formula.

$$R = V\text{max}/V\text{min}$$
$$= (10-2)/(10-0)$$
$$= 80\%$$

In this way, by regulating the current amount of the bandgap current source 41 as appropriate, a photocurrent amount required for changing an output from a low-level state to a high-level state becomes different from a photocurrent amount required for changing the output from the high-level state to the low-level state. As a result, a hysteresis characteristic can be obtained. This reduces dependency of the hysteresis band on the resistance value. As a result, a wider range of the resistance value of the external resistor can be used. Therefore, the configuration of the present embodiment is useful because influence of variation in a latter-stage amplifier and influence of changes in temperature and voltage can be eliminated.

Here, the following explains Comparative Example of the present embodiment.

Figure 11:
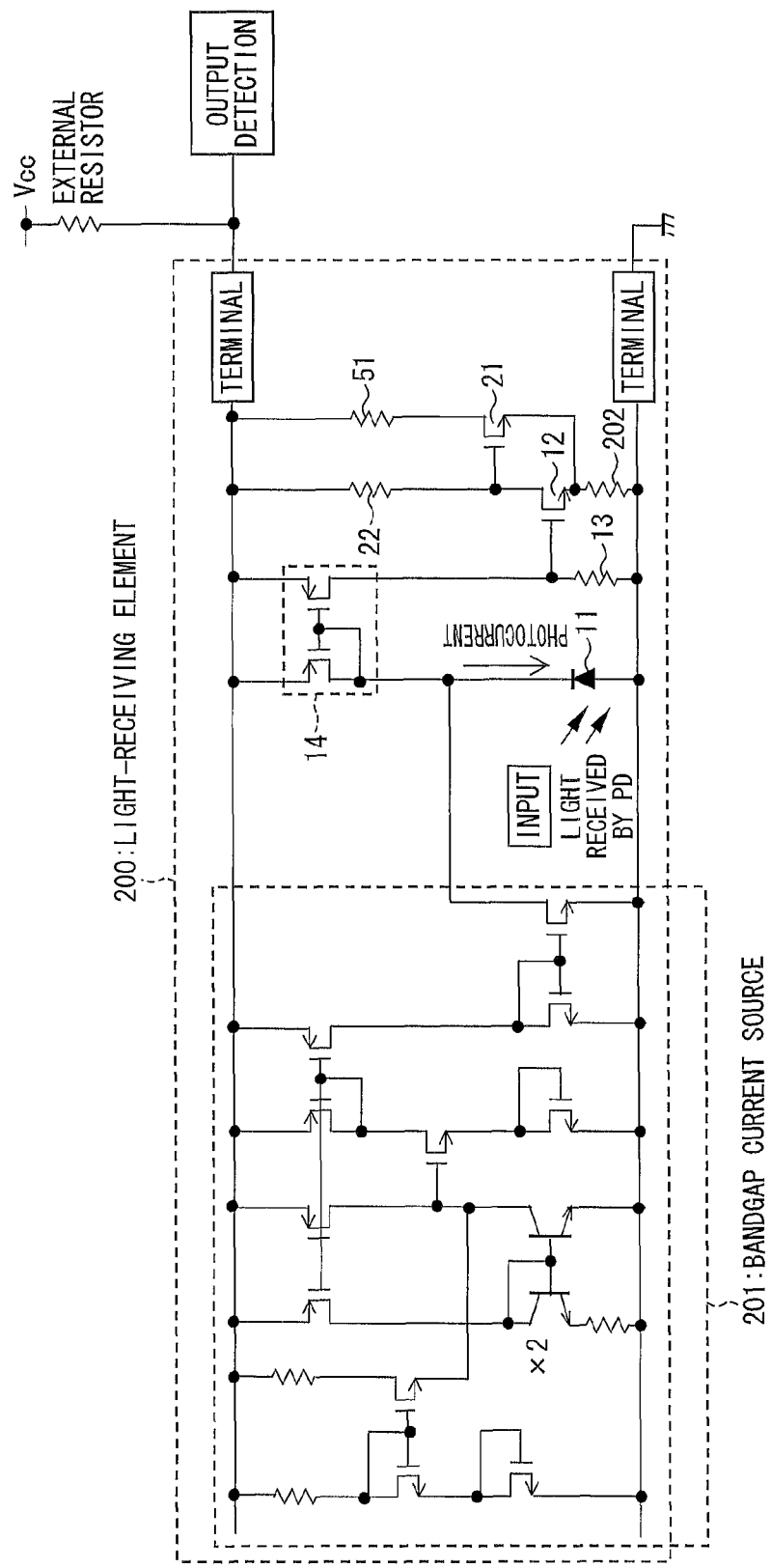
FIG. 11 is a circuit diagram showing a configuration of an optical sensor of Comparative Example with respect to the optical sensor of Embodiment 7.

For example, an optical sensor shown in FIG. 11 includes a light-receiving element 200. This light-receiving element 200 includes a bandgap current source 201 that has a function equivalent to a function of the bandgap current source 41. However, a current amount of the bandgap current source 201 is not regulated as described above. Further, in the light-receiving element 200, a resistor 202 is connected between a fixed-potential terminal of the light-receiving element 200 and the transistor 12.

In the light-receiving element 200 configured as described above, the hysteresis characteristic can be obtained by a potential difference between ends of the resistor 202. However, when a potential difference between two terminals of the light-receiving element 20 becomes the lowest in a case where the transistor 21 operates, a low-level voltage (a potential at the fixed-potential terminal) increases by the potential difference caused by the resistor 202. Therefore, a sufficient potential difference cannot be ensured between the two terminals of the light-receiving element 20.

Therefore, it is preferable to regulate (set) the hysteresis band not by adding a resistor but by using a ratio of the current amount of the bandgap current source 41 and the photocurrent as described above.

Embodiment 8

Circuit Configuration of Optical Sensor

Figure 12:
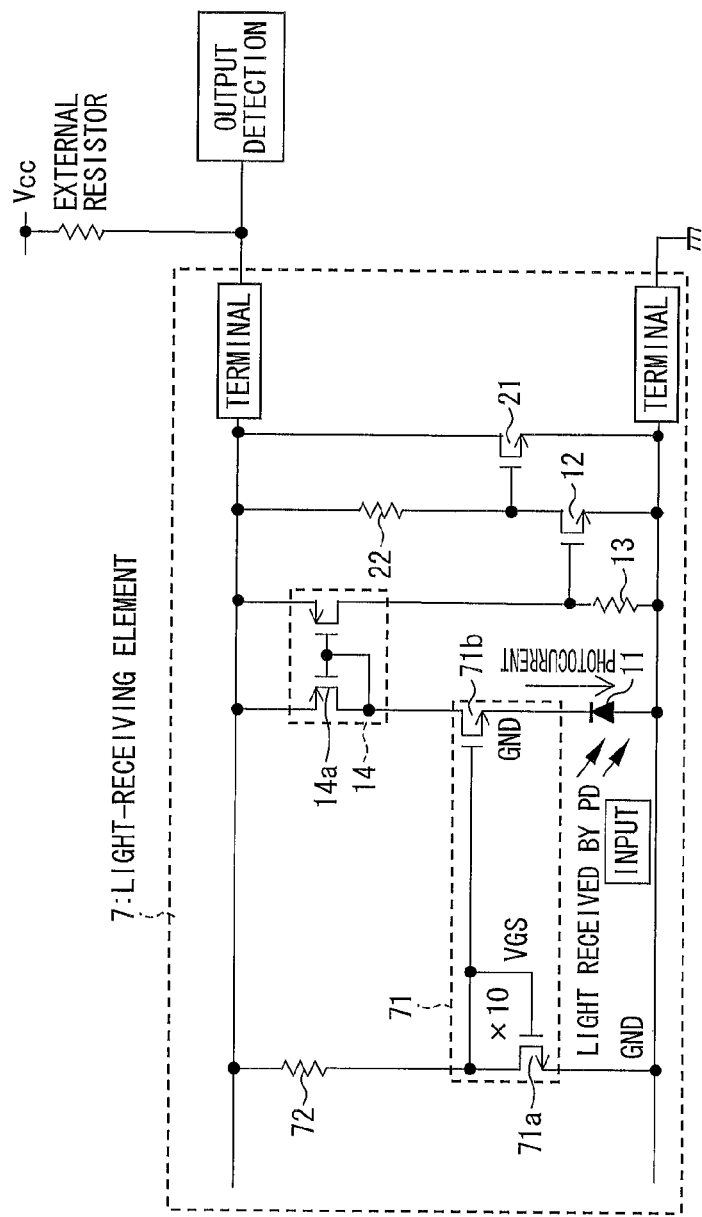
FIG. 12 is a circuit diagram showing a configuration of an optical sensor according to Embodiment 8 of the present invention.

A circuit configuration of an optical sensor of Embodiment 8 is explained with reference to FIG. 12. The optical sensor shown in FIG. 12 is configured to include a light-receiving element 7 in place of a light-receiving element 3 of FIG. 3. Members that are shown in FIG. 12 and have identical configurations to those of the members in FIG. 3 are respectively provided with the same reference numerals as those of the members in FIG. 3 and detailed explanations thereof are omitted.

When a photocurrent is turned on/off, a delay in operation occurs due to a capacitance that the photodiode 11 itself has or the like and a response characteristic may deteriorate. For solving this problem, in Embodiment 3, a current source (third current mirror circuit 31) is provided in parallel to a photo diode in which photocurrent flows. However, in the configuration of Embodiment 3, a photosensitivity characteristic varies due to variation in current of the current source. Consequently, due to this variation in current, the photosensitive characteristic may deteriorate.

In order to solve the above problem, the present embodiment is configured such that a bias between an anode and a cathode of the photodiode 11 is always set at 0. This is for preventing influence of a current of a current source.

As shown in FIG. 12, the light-receiving element 7 includes, as a configuration for solving the above problem, a zero bias circuit 71 and a resistor 72.

The zero bias circuit 71 includes transistors 71a and 71b. A gate and a source of the transistor 71a are connected (diode connection) to each other and a drain of the transistor 71a is connected to a fixed-potential terminal of the light-receiving element 7. Further, an end of the resistor 72 is connected to an output detection terminal of the light-receiving element 7 and the other end of the resistor 72 is connected to a source of the transistor 71a. Meanwhile, a source of the transistor 71b is connected to a drain of the transistor 14a in the current mirror circuit 14 and a drain of the transistor 71b is connected to a cathode of the photodiode 11. Further, gates of the transistors 71a and 71b are connected to each other and thereby a current mirror circuit is formed.

(Operation of Optical Sensor)

In the light-receiving element 7 configured as described above, the transistors 71a and 71b form a gate grounded circuit. Accordingly, due to VGS (gate-source voltage) and a GND potential (at the drain) of the transistor 71a, the drain of the transistor 71b is also set at a GND potential. Therefore, a potential difference between the anode and the cathode of the photodiode 11 becomes 0. Further, in the transistor 71b, a source signal directly becomes a drain signal. Therefore, there is no problem in signal transmission.

By setting the bias of the photodiode 11 at 0 as described above, it becomes unnecessary in the photodiode 11 to charge a capacitance of the photodiode 11 itself even when a photocurrent enters the photodiode 11. This makes it possible to omit a current source as used in Embodiment 3. Therefore, a current amount of the current source is eliminated and in addition, variation in the current amount can be suppressed. This makes it possible not only to suppress variation in photosensitivity characteristic but also to drive the light-receiving element 7 with a smaller current. Therefore, the configuration of the present embodiment is useful.

(Detailed Explanation of Zero Bias Control)

In regard to the transistors 71a and 71b provided side by side in the light-receiving element 7, a current that flows in the transistor 71a is determined by a current that flows in the resistor 72. Therefore, it is difficult to generate a minute current equivalent to a photocurrent. As a result, VGS (gate-source voltage) of the transistors 71a becomes different from VGS of the transistor 71b. Consequently, it becomes difficult to regulate a bias of the photodiode 11 to zero.

For solving the above problem, in the present embodiment, for example, the transistors 71a and 71b are formed so that a size of the transistor 71a becomes ten times as large as a size of the transistor 71b. Thereby, The transistors 71a and 72b provided side by side may have equal VGS and variation in VGS may be eliminated. This makes it possible to arrange a potential of the cathode of the photodiode 11 to be closer to zero bias.

In this way, in the present embodiment, by reducing the number of transistors in a circuit connected to the photodiode 11, balancing of VGS becomes possible. This makes it possible to easily regulate a bias of the photodiode 11 so that the bias becomes zero. Therefore, the configuration of the present embodiment is useful.

A ratio of the sizes of the transistors 71a and 72b is not limited to 10. Depending on a design specification of a circuit, the size of the transistor 71a may be set as appropriate so as to be larger than the size of the transistor 71b.

Embodiment 9

Circuit Configuration of Optical Sensor

Figure 13:
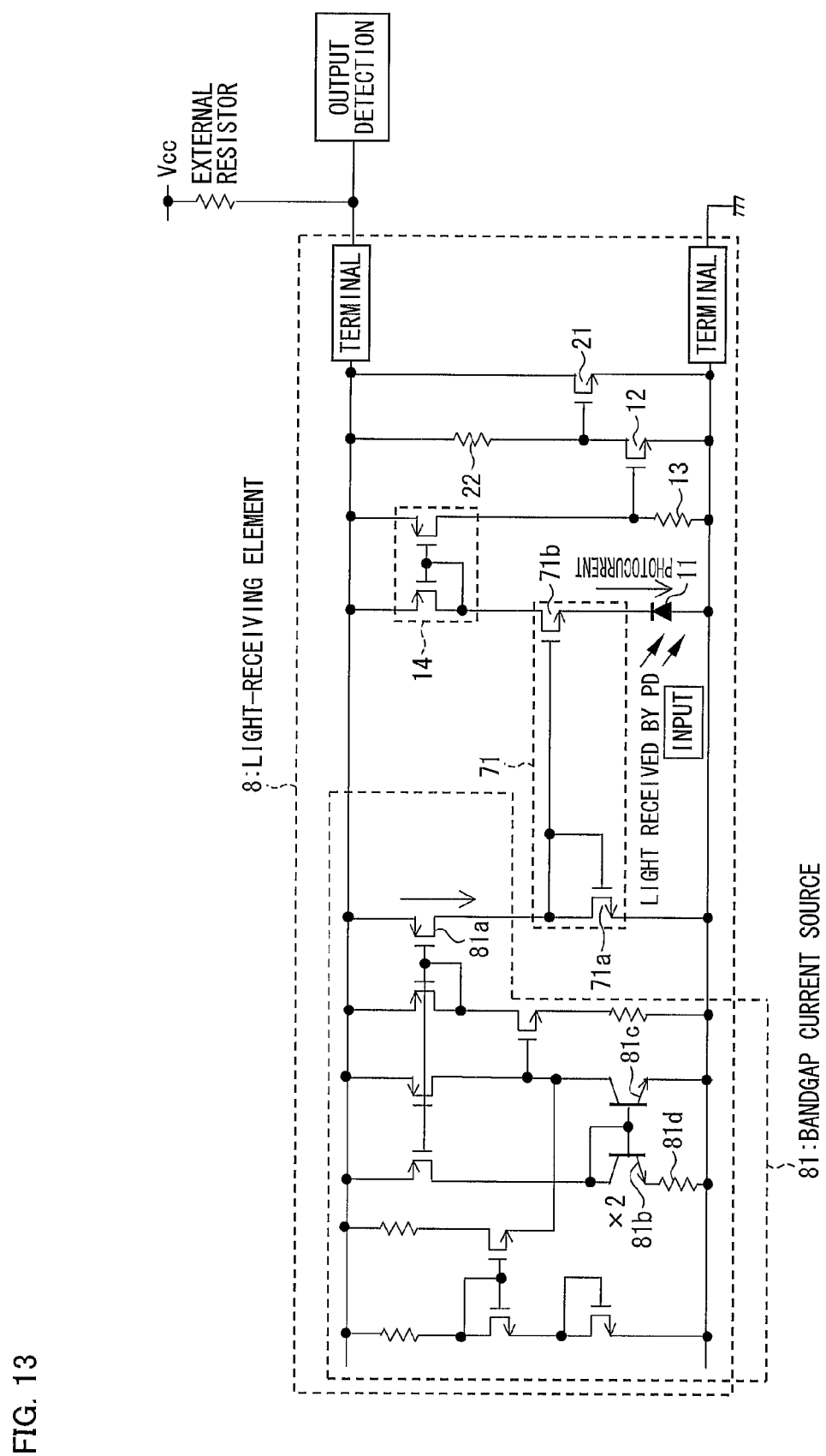
FIG. 13 is a circuit diagram showing a configuration of an optical sensor according to Embodiment 9 of the present invention.

A circuit configuration of an optical sensor of Embodiment 9 is explained with reference to FIG. 13. The optical sensor shown in FIG. 13 is configured to include a light-receiving element 8 in place of the light-receiving element 7 of FIG. 12. Members that are shown in FIG. 13 and have identical configurations to those of members in FIG. 12 are respectively provided with the same reference numerals as those of the members in FIG. 12 and detailed explanations thereof are omitted.

In an optical sensor of the present embodiment, the light-receiving element 8 is configured by replacing the resistor 72 of the light-receiving element 7 with a bandgap current source 81. This bandgap current source 81 has a transistor 81a that causes a current to flow in the above-described transistor 71a. This transistor 81a is connected between an output detection terminal of the light-receiving element 8 and the transistor 71a. The transistor 81a is provided in a position of the resistor 72 of the configuration described in the above embodiment.

(Operation of Optical Sensor)

In the optical sensor configured as described above, for driving the zero bias circuit 71, VGS needs to reach a predetermined value so that each of the transistors 71a and 71b operates. This requires a minimum amount of current. A current value of the minimum amount of current depends on a characteristic of a transistor, but is preferably in a range not less than approximately some nA. Accordingly, as a current source for supplying a current to the zero bias circuit 71, the present embodiment employs the bandgap current source 81 but not the above-described resistor whose current depends on a temperature and a voltage Vcc of a power supply.

In the bandgap current source 81, an output current value is determined by the transistors 81b and 81c and a resistor 81d that generate a bandgap voltage. Here, a ratio of sizes of the transistors 81b and 81c that are bipolar transistors is 2:1. Accordingly, a reference current Ir of the bandgap current source 81 is expressed in the following formula.

$$Ir = Vt \times \ln 2 / R$$

where:
Vt=kT/q (k: Boltzmann constant, q: elementary charge, T: absolute temperature); and R is a resistance value of the resistor 81d.

At a normal temperature, Vt is 26 mV. Accordingly, by setting a value of R to 10 kΩ, a reference current Ir of 1.8 uA is generated.

The above formula does not include the voltage Vcc of the power supply (voltage value of an external power source). This means that the reference current Ir does not depend on the voltage Vcc of the power supply. Further, regarding a temperature characteristic, because Vt varies at −2 mV/° C., dependency of the reference current Ir on temperature can be suppressed by using, as the resistor 81d, a device having a temperature characteristic such that a resistance value increases at a higher temperature.

This reduces influence of the voltage Vcc of the power supply and a temperature onto a current supplied to the zero bias circuit 71. Therefore, variation in current value can be suppressed. This makes it possible to arrange the current supplied to the zero bias circuit 71 to be small, by suppressing variation in current caused by the influence of the voltage Vcc of the power supply and a temperature.

Accordingly, by setting the amount of the current of the zero bias circuit 71 to the minimum, a greater value can be obtained as the maximum potential difference between two terminals of the light-receiving element 8. Therefore, the configuration of the present embodiment is useful.

Embodiment 10

Circuit Configuration of Optical Sensor

Figure 14:
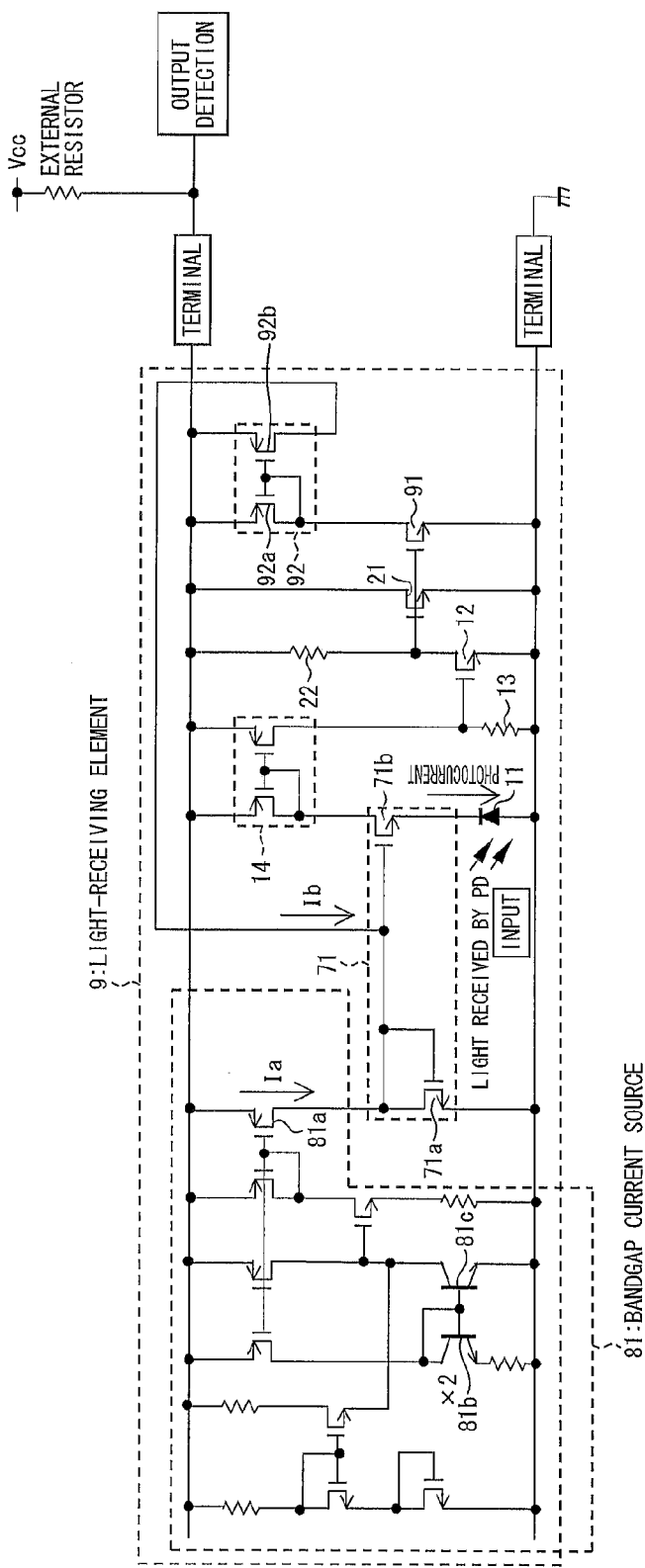
FIG. 14 is a circuit diagram showing a configuration of an optical sensor according to Embodiment 10 of the present invention.

A circuit configuration of an optical sensor of Embodiment 10 is explained with reference to FIG. 14. The optical sensor shown in FIG. 14 is configured to include a light-receiving element 9 in place of a light-receiving element 8 of FIG. 13. Members that are shown in FIG. 14 and have identical configurations to those of members in FIG. 13 are respectively provided with the same reference numerals as those of the members in FIG. 13 and detailed explanations thereof are omitted.

In the light-receiving element 8 described above, when the potential difference decreases between the two terminals of the light-receiving element 8, the bandgap current source 81 may not operate and a current value may be insufficient. More specifically, in the bandgap current source 81, a MOS transistor is connected to each of the transistors 81b and 81c and accordingly, two stages of transistor circuits are provided between the two terminals of the light-receiving element 8. As a result, when no photocurrent flows, the transistor 21 is turned on. Accordingly, when a voltage between the two terminals decreases, only the transistor 21 (one stage) is turned on between the two terminals. Therefore, a voltage applied to the transistor circuit having a two-stage configuration in the bandgap current source 81 becomes insufficient. Consequently, an operation of the bandgap current source 81 may become insufficient.

In order to solve the above problem, an optical sensor of the present embodiment is configured so that the above disadvantage is avoided. More specifically, as shown in FIG. 14, the light-receiving element 9 is configured by further adding, to the light-receiving element 8, a transistor 91 and a fourth current mirror circuit 92.

The transistor 91 (current supply circuit) has a gate connected to a gate of the transistor 21, and a drain of the transistor 91 is connected to a fixed-potential terminal of the light-receiving element 9. Moreover, the fourth current mirror circuit 92 (current supply circuit) includes transistors 92a and 92b. A source of the transistor 92a is connected to an output detection terminal of the light-receiving element 9, while a drain of the transistor 92a is connected to a source of the transistor 91. Further, a drain of the transistor 92a is connected to a gate of the transistor 92a. Meanwhile, a source of the transistor 92b is connected to the output detection terminal of the light-receiving element 9, while a drain of the transistor 92b is connected to respective gates of the transistors 71a and 71b of the zero bias circuit 71. Further, gates of the transistors 92a and 92b are connected to each other.

(Operation of Optical Sensor)

In the optical sensor configured as described above, in a case where only the transistor 21 is turned on when a voltage between two terminals of the light-receiving element 9 decreases, a voltage applied to the bandgap current source 81 becomes insufficient. As a result, a current Ia supplied to the zero bias circuit 71 becomes insufficient. However, at this time, the transistor 91 provided side by side with the transistor 21 is turned on. Therefore, a current also flows in the transistor 91. Then, the fourth current mirror circuit 92 causes a current in accordance with the current flowing in the transistor 91, to flow into the zero bias circuit 71.

As a result, even in a case where the current Ia from the bandgap current source 81 is insufficient, the current Ib covers a deficient part of the current for the zero bias circuit 71. Therefore, a sufficient current can be supplied to the zero bias circuit 71.

In this way, in the present embodiment, when the potential difference between the two terminals increases, the current Ia from the bandgap current source 81 is supplied to the zero bias circuit 71. Meanwhile, when the potential difference between the two terminals decreases, the current Ib from the transistor 91 and the fourth current mirror circuit 92 is supplied to the zero bias circuit 71. This makes it possible to avoid a delay in operation of the zero bias circuit 71 which delay occurs due to a deficiency of current at a decrease in potential difference between the two terminals. Consequently, the operation of the zero bias circuit 71 can be stabilized. Therefore, the configuration of the present embodiment is useful.

Embodiment 11

Circuit Configuration of Optical Sensor

Figure 15:
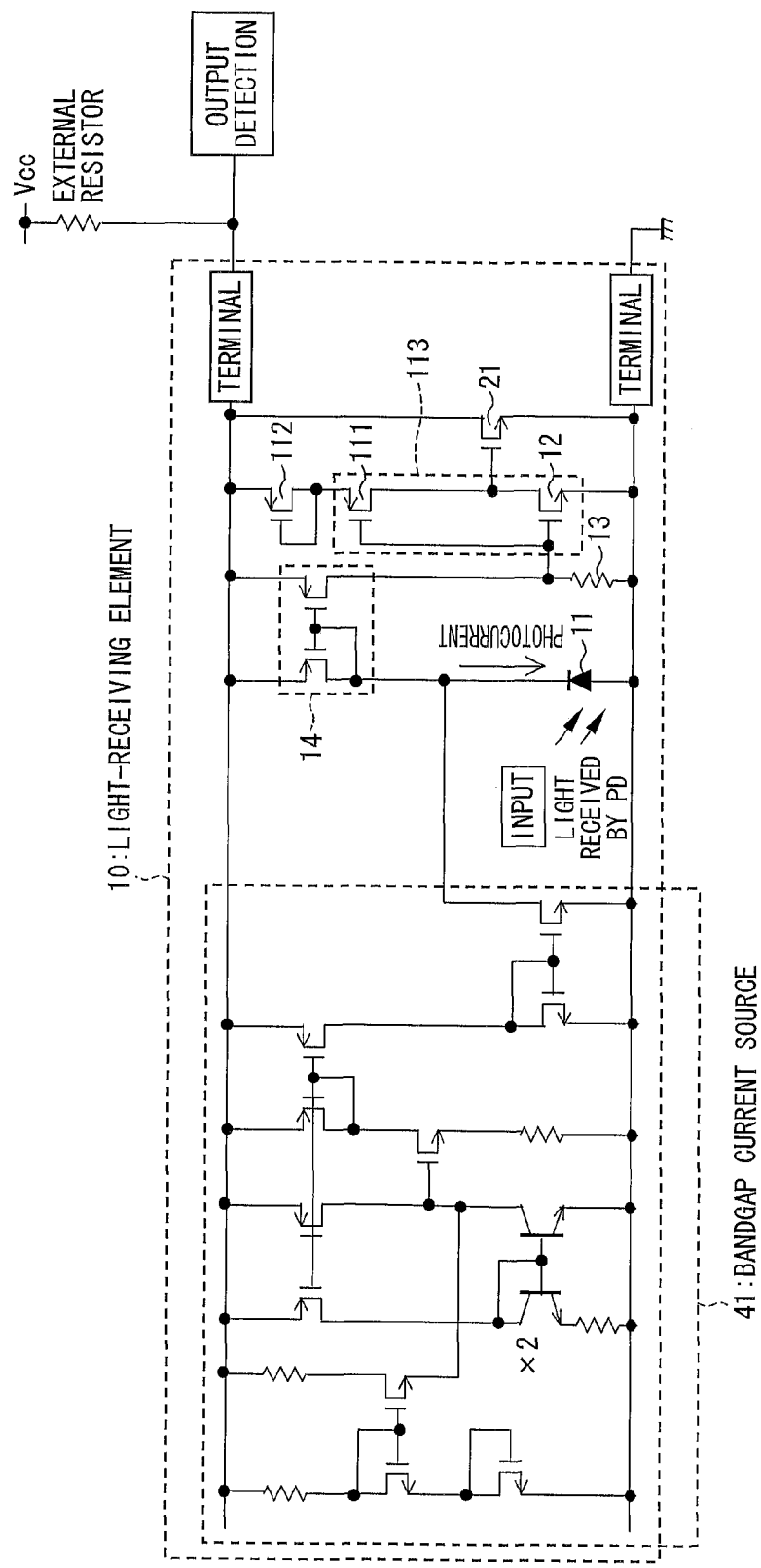
FIG. 15 is a circuit diagram showing a configuration of an optical sensor according to Embodiment 11 of the present invention.

A circuit configuration of an optical sensor of Embodiment 11 is explained with reference to FIG. 15. The optical sensor shown in FIG. 15 is configured to include a light-receiving element 10 in place of a light-receiving element 4 of FIG. 4. Members that are shown in FIG. 15 and have identical configurations to those of members in FIG. 4 are respectively provided with the same reference numerals as those of the members in FIG. 4 and detailed explanations thereof are omitted.

A speed of a switching operation of the transistor 21 is required to be higher because the speed of the switching operation determines a response characteristic of the light-receiving element 10. Therefore, the optical sensor of the present embodiment is configured so that the speed of the switching operation of the transistor 21 can be increased.

More specifically, as shown in FIG. 15, the light-receiving element 10 is configured by replacing the resistor 22 in the light-receiving element 4 described above with transistors 111 and 112.

The transistor 111 has a drain connected to a source of the transistor 12, while a gate of the transistor 111 is connected to a gate of the transistor 12. As a result, the transistor 12 and the transistor 111 become two complementary transistors and form an inverter 113 performing switching control of the transistor 21.

The transistor 112 has a source connected to an output detection terminal of the light-receiving element 10, while a drain of the transistor 112 is connected to a source of the transistor 111. Further, a gate and the drain of the transistor 112 are connected to each other and thereby a diode is formed.

(Operation of Optical Sensor)

In the optical sensor configured as described above, when light is inputted, a current amplified by the first current mirror circuit 14 is converted to voltage by the resistor 13. When the light inputted is so intense that a voltage obtained by the conversion exceeds a threshold voltage of the inverter 113 at this time, the transistor 111 is turned off and the transistor 12 is turned on. As a result, the transistor 21 is turned off. Consequently, a voltage between two terminals of the light-receiving element 10 increases.

Meanwhile, in a case where a photocurrent decreases following a decrease in amount of input light, the current amplified by the first current mirror circuit 14 decreases. Then, a voltage across terminals of the resistor 13 decreases. Then, when gate-source voltages of the transistors 12 and 111 decrease to the threshold voltage of the inverter 113, the transistor 12 is turned off while the transistor 111 is turned on. As a result, the transistor 21 is turned on and a potential difference between the two terminals decreases.

As described above, when the transistor 21 is turned on/off, either the transistor 12 or the transistor 111 is turned on. As a result, the transistor 21 can operate at a higher speed. Consequently, a response speed of the optical sensor can be improved. Therefore, the configuration of the present invention is useful.

Note that in the light-receiving element 10, switching of the transistor 111 needs to be carried out depending on the voltage across the terminals of the resistor 13. Accordingly, a source voltage of the transistor 111 needs to be set lower. That is, it is necessary to prevent switching of the transistor 111 from occurring depending on a source-drain voltage of the first current mirror circuit 14. Therefore, the transistor 112 functioning as a diode is provided in series with respect to the transistor 111.

This also makes it possible to arrange such that an activation point of the inverter 113 in a case where an output shifts from a high-level state to a low-level state at a decrease in voltage across the two terminals is different from an activation point of the inverter 113 in a case where the output shifts from the low-level state to the high-level at an increase in voltage across the two terminals. Therefore, a hysteresis characteristic can be obtained.

Embodiment 12

Circuit Configuration and Operation of Optical Sensor

Figure 16:
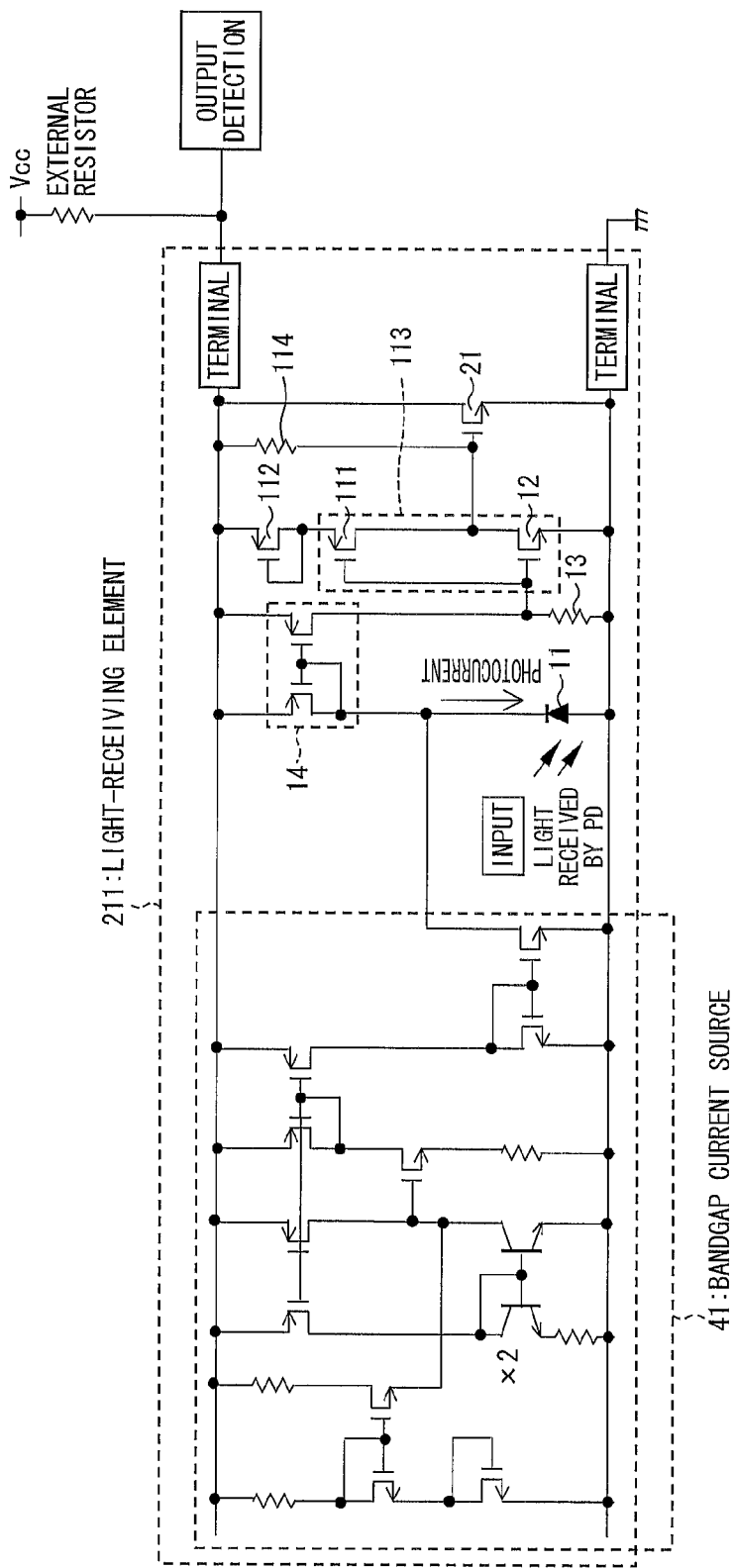
FIG. 16 is a circuit diagram showing a configuration of an optical sensor according to Embodiment 12 of the present invention.

A circuit configuration of an optical sensor of Embodiment 12 is explained with reference to FIG. 16. The optical sensor shown in FIG. 16 is configured to include a light-receiving element 211 in place of a light-receiving element 10 in FIG. 15. Members that are shown in FIG. 16 and have identical configurations to those of members in FIG. 15 are respectively provided with the same reference numerals as those of the members in FIG. 15 and detailed explanations thereof are omitted.

As described above, in the optical sensor of Embodiment 11, the light-receiving element 10 includes the inverter 113. Thereby, the transistor 21 can perform a switching operation at a high speed. However, when a potential difference between the two terminals of the light-receiving element 10 decreases, a potential difference between a gate and a drain of the transistor 111 gradually decreases after the transistor 21 performs switching operation. Then, a current decreases between the gate and the drain of the transistor 111. Therefore, a response speed of the light-receiving element 10 gradually deteriorates.

The optical sensor of the present embodiment is configured so that the above problem can be avoided.

More specifically, as shown in FIG. 16, the light-receiving element 211 is configured by further adding a resistor 114 to the light-receiving element 10.

The resistor 114 is connected between an output detection terminal of the light-receiving element 211 and a gate of the transistor 21. As a result, a decrease in potential difference between the two terminals is complemented by the resistor 114. This makes it possible to prevent deterioration in response speed.

By constituting each transistor in the light-receiving element 211 by a MOS transistor, an operational threshold level of the transistor can be changed by regulating a dose. For example, an operation threshold level may set at less than 0.7 V in the transistor (the transistor 21 in the light-receiving element 211) that generates a current for causing the potential difference between the two terminals. This is because, generally, in a device receiving a detection signal of the optical sensor of the present embodiment, a threshold level is set at 0.7 V that is a diode voltage.

This makes it possible to have a larger potential difference between the two terminals. This makes it possible to widen an operation range of the light-receiving element 211. Therefore, the configuration of the present embodiment is useful.

Embodiment 13

Circuit Configuration and Operation of Optical Sensor

Figure 17:
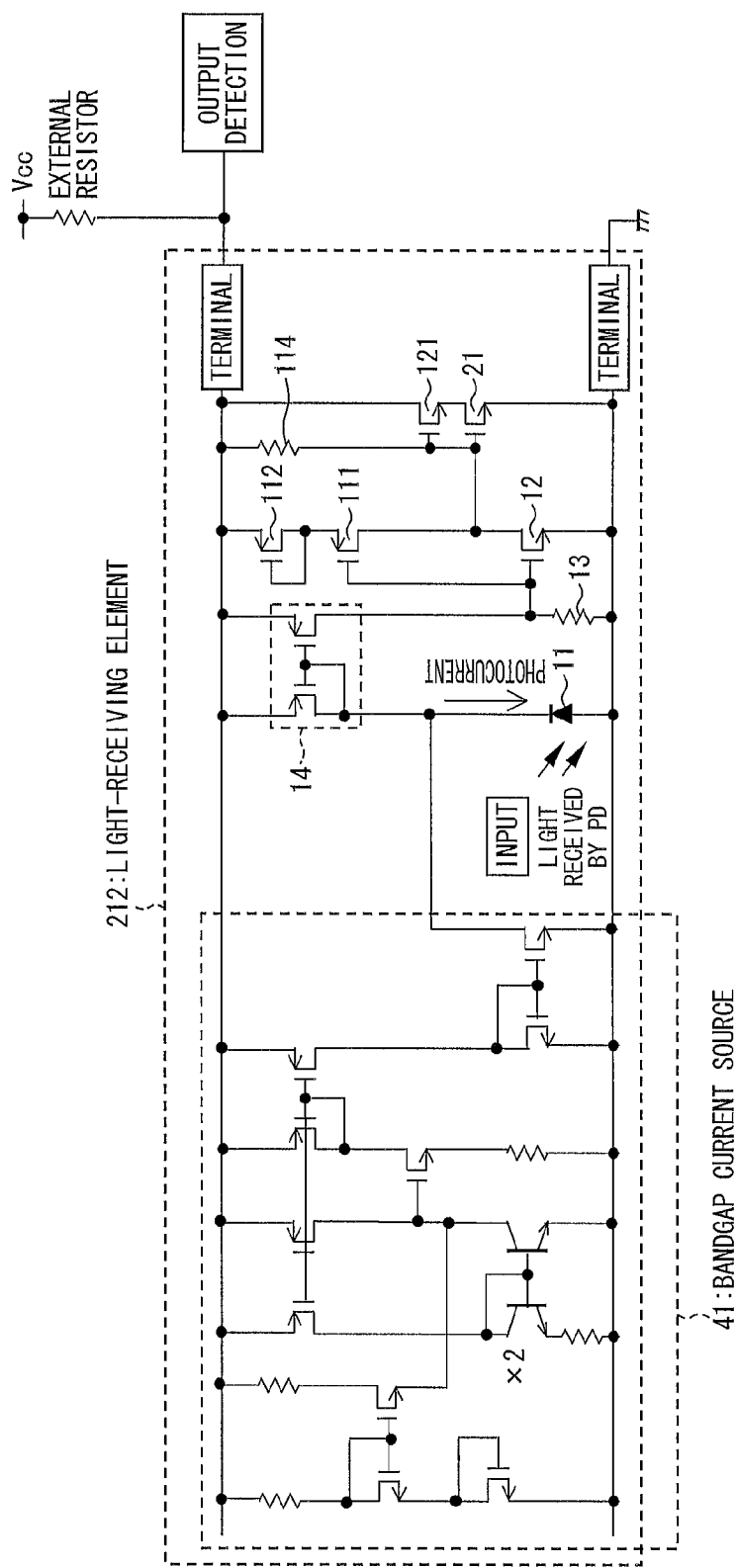
FIG. 17 is a circuit diagram showing a configuration of an optical sensor according to Embodiment 13 of the present invention.

A circuit configuration of an optical sensor of Embodiment 13 is explained with reference FIG. 17. The optical sensor shown in FIG. 17 is configured to include a light-receiving element 212 in place of a light-receiving element 211 in FIG. 16. Members that are shown in FIG. 17 and have identical configurations to those of members in FIG. 16 are respectively provided with the same reference numerals as those of the members in FIG. 16 and detailed explanations thereof are omitted.

Now a case where a transistor having a low threshold level is employed in the optical sensor of Embodiment 12 is considered. In such a case, a leak current may occur when the transistor 21 is turned off at a high temperature. In a case where such a leak current is generated, the following disadvantage may occur. That is, in a case where a potential difference between the two terminals of the light-receiving element 211 should increase normally, the potential difference between the two terminals decreases actually.

The optical sensor of the present embodiment is configured so that such a disadvantage can be avoided.

More specifically, as shown in FIG. 17, the light-receiving element 212 is configured by further adding a transistor 121 (auxiliary transistor) to the light-receiving element 211. A drain of the transistor 121 is connected to an output detection terminal of the light-receiving element 211, while a source of the transistor 121 is connected to a drain of the transistor 21. Further, a gate of the transistor 121 is connected to a gate of the transistor 21. In this way, the transistor 121 and the transistor 21 are cascade-connected.

Accordingly, by decreasing a drain voltage of the transistor 21, a leak current can be significantly reduced to 1/10 or less when the transistor 21 is turned off. The transistor 21 performing the switching operation needs to be formed so as to have a large size, for allowing a large amount of current to flow therein. Therefore, particularly in the transistor 21, the leak current tends to be larger accordingly. In the configuration of the present embodiment, when the potential difference between the two terminals increases, a decrease in potential difference between the two terminals can be prevented. Therefore, the configuration of the present embodiment is useful.

Here, the transistor 12 may malfunction, in a case where variation in threshold level due to a temperature characteristic is large. This is because, a threshold level of a MOS transistor decreases at a high temperature. Meanwhile, in a case where, for example, a diffused resistor is used as a resistor for current-voltage conversion, a resistance value increases at a high temperature. This causes a significant temperature characteristic in sensitivity.

For avoiding such a disadvantage, the optical sensor of the present embodiment is configured such that a resistor 13 (bias resistor) is made of a resistor (e.g., polysilicon resistor) having a negative temperature characteristic. This makes it possible to cancel out the temperature characteristic of the transistor 12 that is the MOS transistor and the temperature characteristic of the resistor 13. As a result, variation in temperature characteristic of the light-receiving element 212 can be suppressed. Therefore, the configuration of the present embodiment is useful.

Embodiment 14

Circuit Configuration of Optical Sensor

Figure 18:
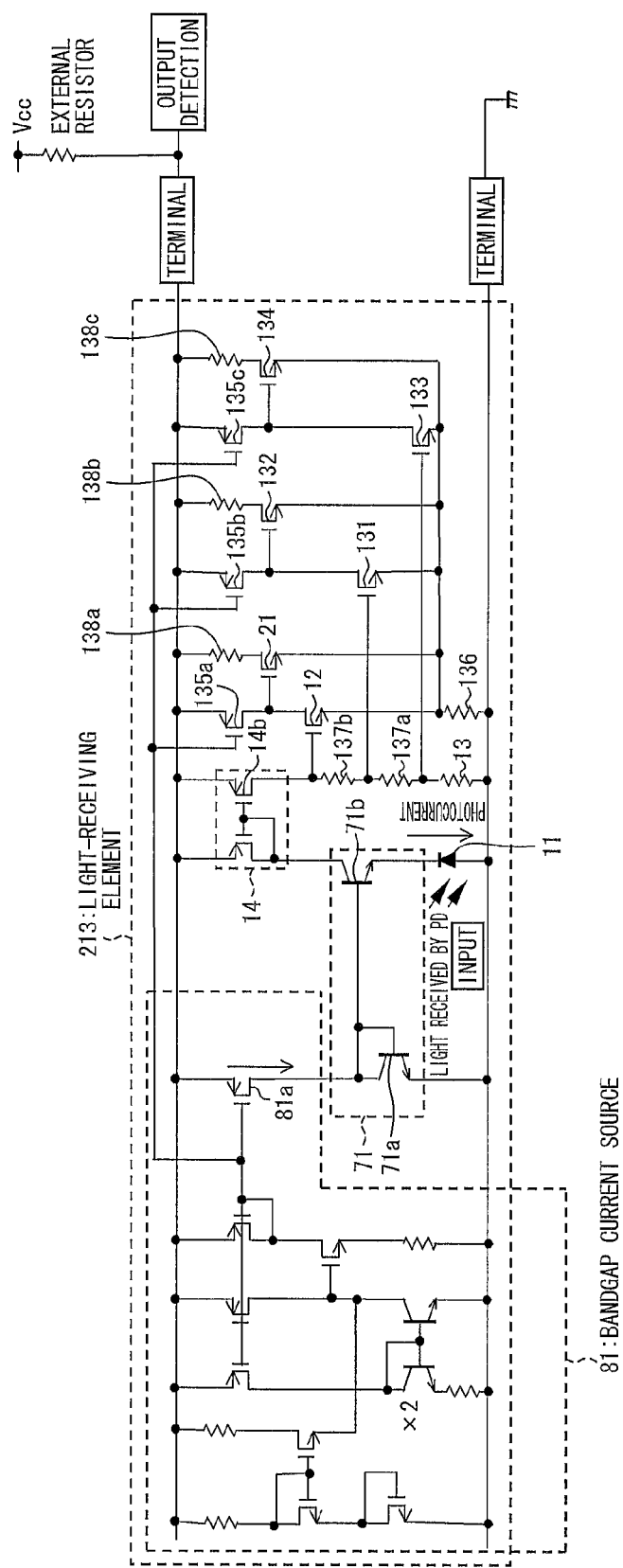
FIG. 18 is a circuit diagram showing a configuration of an optical sensor according to Embodiment 14 of the present invention.

A circuit configuration of an optical sensor of Embodiment 14 is explained with reference to FIG. 18. The optical sensor shown in FIG. 18 is configured to include a light-receiving element 213 in place of a light-receiving element 8 of FIG. 13. Members that are shown in FIG. 18 and have identical configurations to those of members in FIG. 13 are respectively provided with the same reference numerals as those of the members in FIG. 13 and detailed explanations thereof are omitted.

Though the optical sensor of Embodiment 9 can detect the presence of light, the optical sensor of Embodiment 9 cannot determine an amount of input light.

Accordingly, the optical sensor of the present embodiment is configured so that the amount of input light can be determined.

More specifically, as shown in FIG. 18, the light-receiving element 213 is configured by further adding, to the light-receiving element 8, a switching circuit including transistors 131 to 134, transistors 135a to 135c, a resistor 136, resistors 137a and 137b, and resistors 138a to 138c.

One end of the resistor 136 is connected to a fixed-potential terminal of the light-receiving element 213, while the other end of the transistor 136 is connected to drains of transistors 12 and 21. The resistors 137a and 137b connected in series between the transistor 14b and the resistor 13.

Respective gates of the transistors 135a to 135c are connected to a gate of the transistor 81a in the bandgap current source 81. Further, sources of the transistors 135a to 135c are connected to a detection output terminal of the light-receiving element 213. A drain of the transistor 135a is connected to a source of the transistor 12. Furthermore, the resistor 138a is connected between the detection output terminal and a source of the transistor 21.

The transistor 131 has a gate connected to a joint of the resistors 137a and 137b. Further, a source of the transistor 131 is connected to a drain of the transistor 135b while a drain of the transistor 131 is connected to the other end of the resistor 136.

One end of the resistor 138b is connected to the detection output terminal. A gate of the transistor 132 is connected to a joint of the transistors 131 and 135b. A source of the transistor 132 is connected to the other end of the resistor 138b, while a drain of the transistor 132 is connected to the other end of the resistor 136.

A gate of the transistor 133 is connected to a joint of the resistors 13 and 137a. Further, a source of the transistor 133 is connected to a drain of the transistor 135b, while a drain of the transistor 133 is connected to the other end of the resistor 136.

One end of the resistor 138c is connected to the detection output terminal. A gate of the transistor 134 is connected to a joint of the transistors 133 and 135c. A source of the transistor 134 is connected to the other end of the resistor 138c. Further, a drain of the resistor 134 is connected to the other end of the resistor 136.

(Operation of Optical Sensor)

In the optical sensor configured as described above, operation is performed as follows.

First, in a case where light amount is small, only the transistor 12 is turned on (State A). When light amount becomes larger, the transistor 131 is also turned on (State B) because a potential between the resistors 137a and 137b increases. When light amount further increases, the transistor 133 is also turned on (State C) because a potential between the resistors 13 and 137a increases.

In the above configuration, in State A, a value of an output voltage is determined by voltage division based on resistance values of a resistance of the external resistor and a resistance of the resistor 138a. Meanwhile, in State B, a value of an output voltage is determined by voltage division based on resistance values of a resistance of the external resistor and a combined resistance of the resistors 138a and 138b. This makes it possible to arrange the output voltage in State B to be lower than the output voltage in State A. Further, in State C, a value of an output voltage is determined by voltage division based on resistance values of a resistance of the external resistor and a combined resistance of the resistors 138a to 138c. This makes it possible to arrange the output voltage in State C to be more lower.

In this way, in the light-receiving element 213, the output voltage values can be varied at three levels. As a result, an amount of input light can be detected. By providing a plurality of circuit configurations as described above, the output voltage can be varied more precisely. This may improve accuracy of determination of the amount of input light.

Note that as in the above case, the output voltage can be varied by (i) setting resistor values of the resistors 137a and 137b to 0Ω and (ii) changing a threshold level of each of the transistors 12, 131, and 133.

Embodiment 15

Circuit Configuration of Optical Sensor

Figure 19:
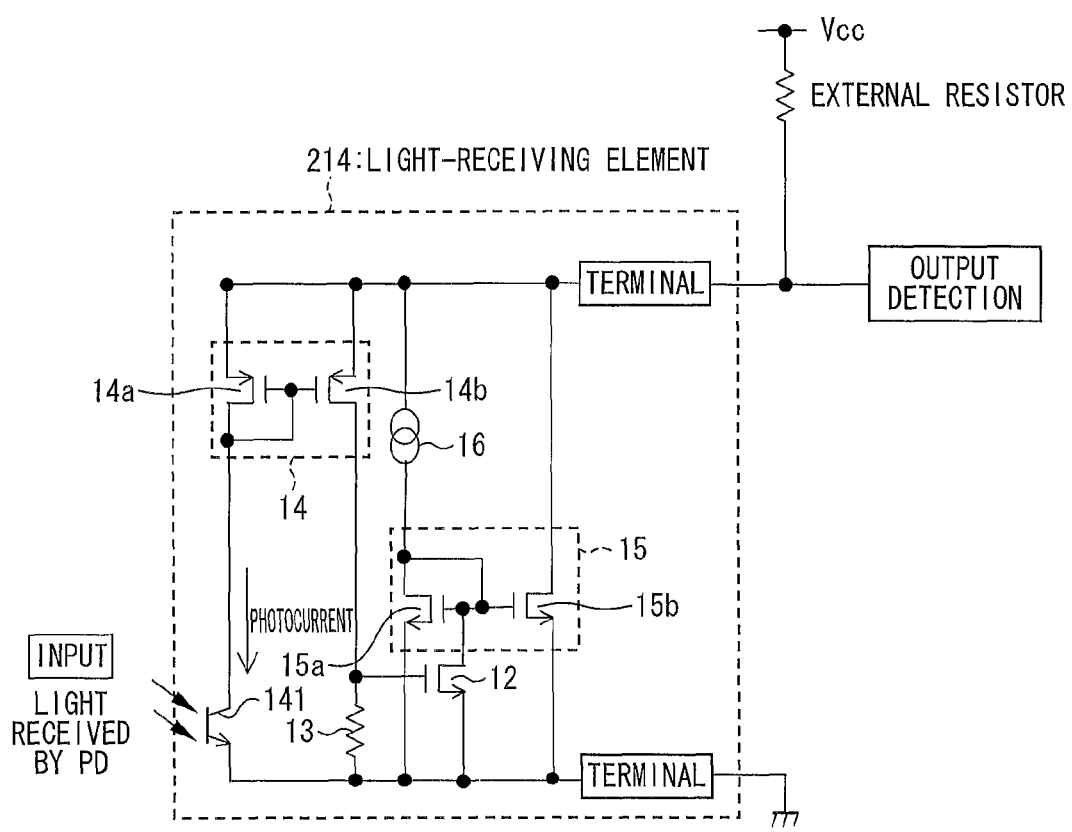
FIG. 19 is a circuit diagram showing a configuration of an optical sensor according to Embodiment 15 of the present invention.
Figure 20:
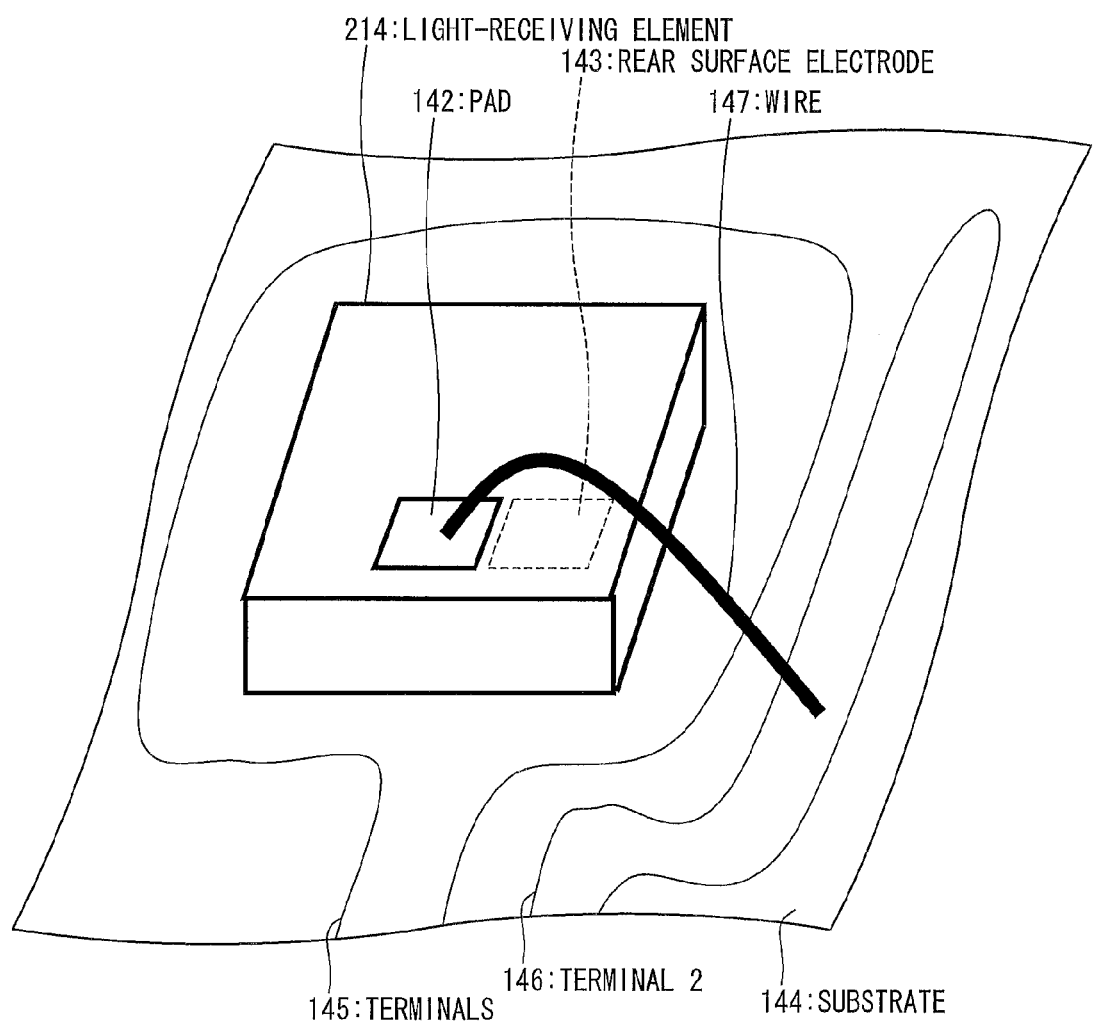
FIG. 20 is a perspective view illustrating a mounting structure of the optical sensor of Embodiment 15 of the present invention.

A circuit configuration and a mounting structure for an optical sensor of Embodiment 15 are explained with reference to FIGS. 19 and 20. The optical sensor shown in FIG. 19 is configured to include a light-receiving element 214 in place of a light-receiving element 1 of FIG. 1. Members that are shown in FIG. 19 and have identical configurations to those of members in FIG. 1 are respectively provided with the same reference numerals as those of the members in FIG. 1 and detailed explanations thereof are omitted.

Each of the above embodiments explains a case where the photodiode 11 is used as a photoelectric conversion element.

Generally, in a light-receiving element employing a photodiode, a circuit is provided in the vicinity of a surface of a substrate. Accordingly, an electrode is provided on a rear surface of the light-receiving element so that a resistor component of the substrate is eliminated.

Meanwhile, conventionally, a phototransistor employed as a photoelectric conversion element in a light receiving element is configured by P or N diffusion of a substrate and N or P diffusion of a front surface. Therefore, in general, an electrode is provided on a rear surface of the light-receiving element. By employing such an electrode structure, a small optical sensor can be obtained.

As shown in FIG. 19, in the optical sensor of the present embodiment, the light receiving element 214 is configured by replacing the photodiode 11 of the light-receiving element 1 in the optical sensor of FIG. 1 with a phototransistor 141 (photoelectric conversion element). Accordingly, the light-receiving element 214 includes the phototransistor 141 as a photoelectric conversion element. As a result, as shown in FIG. 20, the light-receiving element 214 that is a chip is provided with one pad 142 on a front surface and one rear surface electrode 143 on a rear surface of the chip. Thereby, the light-receiving element 214 is die-bonded to a terminal 145 on a substrate 144 (frame) and the pad 142 is connected to a terminal 146 on the substrate 144 via a wire 147.

In this way, the light-receiving element 214 can utilize a conventional package structure by employing a general phototransistor 141 widely used. Therefore, the light-receiving element 214 is useful. On the other hand, regarding the light-receiving elements 1 to 13 each employing the photodiode 11, an electrode like the rear surface electrode 143 needs to be provided in a case where a package structure as described above is to be employed. Therefore, such a case requires introduction of a new package structure.

Note that the present embodiment explains an example in which the photodiode 11 is replaced by the phototransistor 141 in the optical sensor of Embodiment 1 shown in FIG. 1. The present invention is not limited to this. In the optical sensor of each of Embodiments 2 to 14, the photodiode 11 may be replaced by the phototransistor 141 in the same manner as in Embodiment 1.

Embodiment 16

The optical sensor as described in each of Embodiments 1 to 15 is capable of detecting an object and a motion speed of the object. The optical sensor is suitably applied to, for example, electronics devices such as a digital camera, a copying machine, a printer, a mobile device, an electronics device using a motor, and the like each of which requires a light-receiving element having two terminals.

Further, the optical sensor of the present invention is also suitably applied to a smoke sensor, a proximity sensor, a range sensor, and the like for each of which a sufficient capacity cannot be ensured. Each of the smoke sensor, the proximity sensor, and the range sensor can be configured by a detector employing a photodiode. The smoke sensor detects a change in sensitivity depending on an amount of smoke that blocks light between a light-emitting section and a light-receiving section. Meanwhile, each of the proximity sensor and the range sensor detects a reception amount of light that has been emitted from a light emission side and reflected by a detection target object. Therefore, by applying the present invention to any of the above sensors, accurate sensing through two terminals becomes possible. Therefore, the present invention is useful.

(Configuration of Copying Machine)

Figure 21:
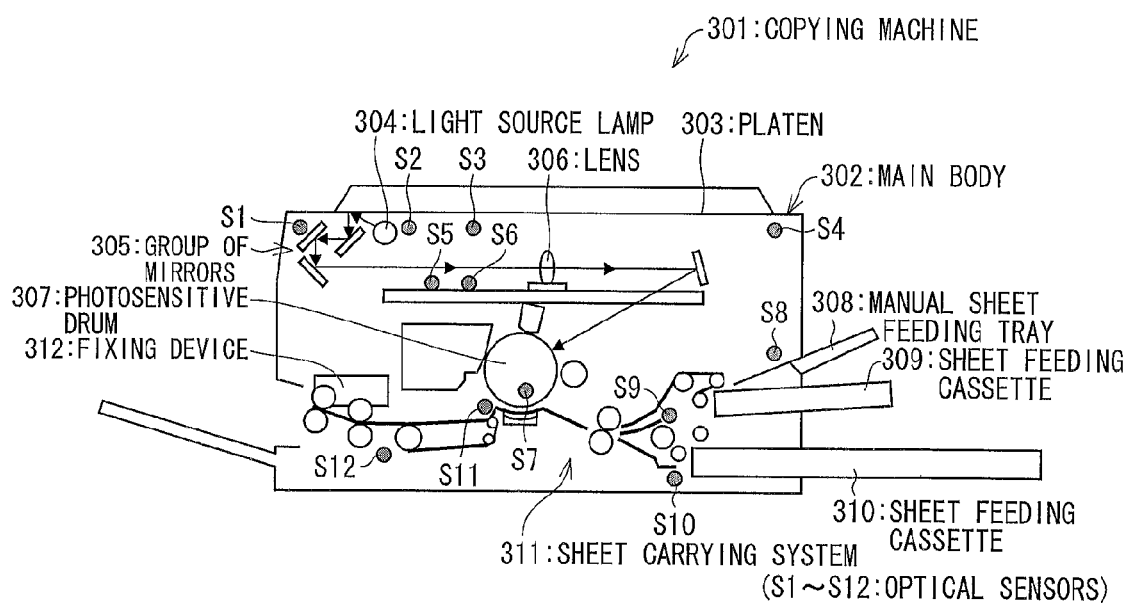
FIG. 21 is a front view illustrating an internal configuration of a copying machine according to Embodiment 16 of the present invention.

Here, the following explains a copying machine as a specific example of an electronics device that employs an optical sensor. FIG. 21 is a front view illustrating an internal configuration of the copying machine.

As shown in FIG. 21, in a copying machine 301, a document placed on a platen 303 provided in an upper section of a main body 302 is irradiated with light of a light source lamp 304. Then, light reflected from the document is thrown onto a charged photosensitive drum 307 via a group of mirrors 305 and a lens 306 and thereby an exposure process is carried out. Further, the copying machine 301 adheres toner onto a static latent image that is formed on the photosensitive drum 307 by the exposure process. As a result, a toner image is formed. Further, the copying machine 301 transfers the toner image on the photosensitive drum 307 onto a sheet supplied via a sheet carrying system 311 from a manual sheet feeding tray 308 or a sheet feeding cassette 309 or 310. Subsequently, the toner image is fixed in a fixing device 312 and then the sheet is discharged to the outside.

In the copying machine 301 configured as described above, for detecting a position of each section or detecting passage of a sheet, optical sensors S1 to S12 are provided. The optical sensor S1 to S4 are provided for detecting a position of a part of the group of mirrors 305 that move in a light scanning direction of a sheet. The optical sensors S5 and S6 are provided for detecting a position of a lens 306 that moves together with the part of the group of mirrors 305. The optical sensor S7 is provided for detecting a rotational position of the photosensitive drum 307.

The optical sensor S8 is provided for detecting the presence of a sheet on the manual sheet feed tray 308. The optical sensor S9 is provided for detecting the presence of a sheet that has been fed from the upper sheet feeding cassette 309 and that is being carried. The optical sensor S10 is provided for detecting the presence of a sheet that has been fed from the lower sheet feeding cassette 310 and that is being carried.

The optical sensor 11 is provided for detecting separation of a sheet from the photosensitive drum 307. Further, the optical sensor S12 is provided for detecting discharge of a sheet to the outside of the copying machine 301.

As described above, the copying machine 301 includes many optical sensors S1 to S12. By using optical sensors of any of Embodiments described above as these optical sensors S1 to S12, a function of the copying machine 301 can be enhanced by the optical sensors S1 to S12.

Note that, for convenience of explanation, the optical sensors S1 to S12 are explained as examples above. However, in an actual copying machine, a larger number of optical sensors are often used. Therefore, in such an electronics device, the above-described effects become more prominent.

The embodiments of the present invention can also be stated as follows.

An optical sensor includes: a light-receiving element having two terminals, the light-receiving element changing, with respect to a fixed potential of one terminal, a potential of the other terminal and thereby detecting a signal; and a current control section on which switching control is carried out by use of a photocurrent that occurs when light is inputted into the light-receiving element, the current control section generating a current that decreases a potential difference between the two terminals, the current being generated when the photocurrent is not produced, the current control section stopping the current when the photocurrent is produced.

In the optical sensor, preferably, the current control section is a transistor on which switching control is carried out by use of a voltage obtained by converting the photocurrent to the voltage.

According to the above configuration, particularly, even in a case where a photocurrent is small, a larger constant current can be obtained by using the current control section that performs switching by a transistor whose voltage is regulated. This makes it possible to have a stable and large change in potential of the optical sensor.

Preferably, the optical sensor further includes: a current source provided in parallel to an element that produces the photocurrent, the photocurrent and a current supplied by the current source being input into one amplified and used for the switching control on the current control section.

In a configuration where the switching control of the current control section is carried out only by the photocurrent, when the photocurrent is turned on/off, a delay in operation may occur due to a capacitance of the photodiode itself or the like. This may deteriorate a response characteristic. Meanwhile, according to the above configuration, a current source is provided in parallel to a photo diode in which a photocurrent flows, and a current from the current source and a photocurrent from the photocurrent source are inputted into one amplifier. This improves an operation speed at the time when the photocurrent is turned on/off. Further, the above amplifier is not completely turned off but is always capable of operating. As a result, a response speed is improved.

In the optical sensor, preferably, the current supplied by the current source does not vary depending on a voltage value of an external power supply.

In a case where a current of the current source varies following a voltage value of the external power source, for example, the current of the current source may increase when, for example, a potential is large. Then, a light detection range may be narrower. On the other hand, according to the above configuration, for example, a current that does not depend on a change in potential is generated by using a bandgap current source as the current source. Then, light can be stably detected regardless of the voltage value of the external power source.

In the optical sensor, preferably, a minimum value of a variable potential is determined by resistance division between an external resistor provided externally to the light-receiving element and a resistor within the light-receiving element.

In the above configuration, a minimum value of a variable potential is determined in accordance with a ratio of a resistance of a pull-up resistor in an internal circuit of the light-receiving element with respect to a resistance of a resistor externally provided to the light-receiving element. Then, it is possible to set a voltage that is dependent on the externally provided resistor, and a stable voltage can be obtained.

In the optical sensor, preferably, the light-receiving element has a hysteresis characteristic.

In the above configuration, a range in which the optical sensor is used can be regulated in accordance with a hysteresis band of the light-receiving element. This makes it possible to prevent a problem of a chattering phenomenon caused by influence of an external disturbance.

In the optical sensor, preferably, a current amount of the current source is set so that a hysteresis characteristic is given in a ratio of (a) a value obtained by subtracting the current amount of the current source from the photocurrent when the potential difference between the two terminals is maximum and (b) a value of obtained by subtracting the current amount of the current source from the photocurrent when the potential difference between the two terminals is minimum.

In the above configuration, the hysteresis characteristic is given in a ratio of a maximum value and a minimum value of the potential difference between the two terminals. Further, each of the maximum value and the minimum value are proportional to a value obtained by subtracting the current amount of the current source from the photocurrent. If the current amount of the current source is appropriately set with respect to the photocurrent, the current source is turned off and the current of the current source becomes 0 A when the potential difference between the two terminals becomes the minimum value. In this way, by regulating the current amount of the current source as appropriate, a hysteresis characteristic can be obtained because a photocurrent amount required to change an output from a low-level state to a high-level state is different from a photocurrent amount required to change the output from the high-level state to the low-level state.

As a result, dependency of the hysteresis band on a resistance value is reduced. This makes it possible to use a resistance value of the externally provided resistor in a wider range. Consequently, influence of variation in a latter-stage amplifier and influence of changes in temperature and voltage can be eliminated. Therefore, the configuration of the present invention is useful.

Preferably, the optical sensor includes: a photoelectric conversion element generating the photocurrent; and a zero bias circuit causing a bias between terminals of the photoelectric conversion element to be zero.

In a case where, for example, a photodiode is used as the photoelectric conversion element, a delay in operation occurs when the photocurrent is turned on/off. The delay in operation occurs due to a capacitance or the like that the photodiode itself has. This may deteriorate a response characteristic. In order to solve this problem, it is effective to provide a current source in parallel to an element that produces the photocurrent as described above. However, variation in current changes a characteristic and accordingly, a photosensitivity characteristic may deteriorate due to the variation in current.

For solving the above problem, in the above configuration, a bias between the terminals of the photoelectric conversion element is always set at zero by the zero bias circuit. Accordingly, when a photocurrent is inputted, it becomes unnecessary in the photoelectric conversion element itself to charge a capacitance thereof. This makes it possible to omit the current source. As a result, the current amount of the current source can be eliminated. Further, variation in the current amount can be suppressed. Therefore, variation in the photosensitivity characteristic can be suppressed. In addition, it becomes possible to drive the photoelectric conversion element with a smaller current becomes possible. Therefore, the configuration of the present invention is useful.

In the optical sensor, preferably, the zero bias circuit includes: a first transistor provided in series with respect to the photoelectric conversion element; and a second transistor diode-connected between the two terminals and having a gate connected to a gate of the first transistor; and a size of the second transistor is larger than a size of the first transistor.

Because a current flowing in the second transistor is determined by a current flowing in a current supply circuit such as a resistor or the like, it is difficult to generate a minute current that is equivalent to the photocurrent. As a result, gate-source voltages of the first transistor and the second transistor become different. As a result, it becomes difficult to regulate so that the bias of the photoelectric conversion element becomes zero.

In order to solve the above problem, in the above configuration, a size of the second transistor in which a current greater than that in the first transistor is arranged to be larger than a size of the first transistor. This makes it possible to regulate the gate-source voltages of the first transistor and the second transistor so that the gate-source voltages become equal. As a result, the bias of the photoelectric conversion element can be easily regulated so as to be zero. Therefore, the configuration of the present invention is useful.

Preferably, the optical sensor includes: a current source supplying the zero bias circuit with a current that does not vary depending on a voltage value of an external power supply.

For driving the zero bias circuit, the gate-source voltages of the first transistor and the second transistor is required to reach predetermined values so that the first transistor and the second transistor operate. For causing the gate-source voltages to reach the predetermined values, a minimum amount of current is required. In the above configuration, for satisfying this requirement, the zero bias circuit can be supplied with the minimum amount of current that does not receive influence of the voltage value of the external power source by the current source. Therefore, when the potential difference between the two terminals becomes the maximum, a greater potential difference can be obtained by arranging the current supplied to the zero bias circuit to be minimum.

Preferably, the optical sensor further includes: a current supply circuit supplying a current to the current source when the potential difference between the two terminals decreases, the potential difference being a voltage between the two terminals.

In the above configuration, a current is supplied to the current source by the current supply circuit, even in a case where the current source does not operate and a current value becomes insufficient at the time when the potential difference between the two terminals decreases. This ensures a sufficient current supplied from the current source to the zero bias circuit at the time when the potential difference between the two terminals decreases. Therefore, the zero bias circuit can stably operate.

Preferably, the optical sensor includes: an inverter carrying out the switching control of the transistor.

In the above configuration, when light is inputted, either one of two complementary transistors constituting the inverter is turned on and the other one of the two complementary transistors is turned off. Meanwhile, when an amount of input light decreases and the current decreases, either one of the two complementary transistors is turned off and the other one of the two complementary transistors is turned on. This on/off operation of the complementary transistors turns on/off the transistor. Therefore, switching of the transistor can be regulated at a high speed without a delay. This makes it possible to improve a response speed of the optical sensor.

Preferably, the optical sensor further includes a resistor connected between the other terminal and a gate of the transistor.

When the potential difference between the two terminals decreases, a potential difference gradually decreases after switching operation and accordingly a current decreases in a complementary transistor provided between a gate and a drain of the transistor among the complementary transistors in the inverter. Accordingly, the response speed of the optical sensor gradually deteriorates.

On the other hand, in the above configuration, the resistor is connected between the other terminal and a gate of the transistor. Therefore, a current may be caused to flow into the gate of the transistor from the other terminal and the decrease in the potential difference between the two terminals may be assisted. This makes it possible to prevent deterioration in response speed of the optical sensor.

Preferably, the optical sensor includes a transistor carrying out switching between the two terminals for causing the potential difference between the two terminals, the transistor having a threshold level set at lower than 0.7 V.

In the above configuration, a threshold level of the transistor is set low. For example, in a case where a MOS transistor is used as the transistor, the threshold level can be changed by regulating a dose or the like. By setting the threshold level low, the potential difference between the two terminals can be set higher. This makes it possible to widen an operation range of the optical sensor. Therefore, the configuration of the present invention is useful.

Preferably, the optical sensor further includes an auxiliary transistor cascade-connected to the transistor.

In a case where a transistor having a low threshold level as described above is employed, a leak current may occur when a transistor is turned off at a high temperature. In order to solve this problem, an auxiliary transistor that is cascade-connected to the transistor is provided. Then, by decreasing a drain voltage of the auxiliary transistor, the leak current can be reduced to $\frac{1}{10}$ or less at the time when the transistor is turned off. This makes it possible to suppress decrease in potential difference between the two terminals in a case where the potential difference between the two terminals is to increase. Therefore, the configuration of the present invention is useful.

Preferably, the optical sensor further includes a bias resistor for causing a switching operation of the transistor, the bias resistor having a negative thermal characteristic.

The transistor may malfunction in a case where the temperature characteristic of the threshold level changes to a large extent. This is because the threshold level of the MOS transistor decreases at a high temperature. Meanwhile, for example, when a diffused resistor is used as the resistor for current-voltage conversion, the resistor value increases at a high temperature. As a result, a significant temperature characteristic is produced in sensitivity.

In order to solve the above problem, the bias resistor is configured by a resistor (e.g., polysilicon resistor) that has a negative temperature characteristic. Then, the temperature characteristic of the threshold level of the MOS transistor can be canceled out. Consequently, variation in temperature characteristic of the optical sensor decreases. Therefore, the configuration of the present invention is useful.

Preferably, the optical sensor further includes a switching circuit switching an amount of the current in accordance with a photocurrent amount.

In the above configuration, in a case where it is required to monitor not only the presence of light but also an amount of input light, switching of the current amount is carried out by the switching circuit in accordance with a photocurrent amount. This makes it possible to change an output voltage value and as a result, makes it possible to detect the amount of input light.

In the optical sensor, preferably, the light-receiving element has an electrode to be connected to one of the two terminals, the electrode being provided on a rear surface of a package.

In the above configuration, it is possible to employ an electrode structure (rear surface electrode) in a package of a light-receiving element that includes a phototransistor and that has conventionally been used as a photoelectric conversion element. Accordingly, it becomes not necessary to prepare a new package. Therefore, the configuration of the present invention is useful.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention makes it possible to detect an object and a motion speed of an object. The present invention is applicable to, for example, electronics devices such as a digital camera, a copying machine, a printer, a portable device, an electronics device employing a motor and the like, each of which employs a photo interrupter in which a light-receiving element is required to have two terminals.

REFERENCE SIGNS LIST 1 to 10 light-receiving elements
11 photodiode (photoelectric conversion element)
12 transistor
13, 22, 32, 51 resistors
14 first current mirror circuit (amplifier)
15 second current mirror circuit (current control section)
16 constant current source
21 transistor (current control section)
31 third current mirror circuit (current source)
41, 81 bandgap current sources
71 zero bias circuit
81a to 81c transistors
91 transistor (current supply circuit)
92 fourth current mirror circuit (current supply circuit)
114 resistor
121 transistor (auxiliary transistor)
131 to 134 transistors
137a and 137b resistors
138a to 138c resistors
141 phototransistor (photoelectric conversion element)
142 pad
143 rear surface electrode
144 substrate
145 and 146 terminals
147 wire
211 to 214 light-receiving elements
301 copying machine (electronics device)
S1 to S12 optical sensors

The invention claimed is:
1. An optical sensor comprising:
a light-receiving element having two terminals, the light-receiving element changing, with respect to a fixed potential of one terminal, a potential of the other terminal and thereby detecting a signal; and
a current control section on which switching control is carried out by use of a photocurrent that occurs when light is inputted into the light-receiving element,
the current control section generating a current that decreases a potential difference between the two terminals, the current being generated when the photocurrent is not produced,
the current control section stopping the current when the photocurrent is produced.

2. The optical sensor as set forth in claim 1, wherein:
the current control section is a transistor on which switching control is carried out by use of a voltage obtained by converting the photocurrent to the voltage.
3. The optical sensor as set forth in claim 1, further comprising:
a current source provided in parallel to an element that produces the photocurrent,
the photocurrent and a current supplied by the current source being input into one amplified and used for the switching control on the current control section.
4. The optical sensor as set forth in claim 3, wherein:
the current supplied by the current source does not vary depending on a voltage value of an external power supply.
5. The optical sensor as set forth in claim 1, wherein:
a minimum value of a variable potential is determined by resistance division between an external resistor provided externally to the light-receiving element and a resistor within the light-receiving element.
6. The optical sensor as set forth in claim 1, wherein:
the light-receiving element has a hysteresis characteristic.
7. The optical sensor as set forth in claim 3, wherein:
a current amount of the current source is set so that a hysteresis characteristic is given in a ratio of (a) a value obtained by subtracting the current amount of the current source from the photocurrent when the potential difference between the two terminals is maximum and (b) a value of obtained by subtracting the current amount of the current source from the photocurrent when the potential difference between the two terminals is minimum.
8. The optical sensor as set forth in claim 1, comprising:
a photoelectric conversion element generating the photocurrent; and
a zero bias circuit causing a bias between terminals of the photoelectric conversion element to be zero.
9. The optical sensor as set forth in claim 8, wherein:
the zero bias circuit includes:
a first transistor provided in series with respect to the photoelectric conversion element; and
a second transistor diode-connected between the two terminals and having a gate connected to a gate of the first transistor; and
a size of the second transistor is larger than a size of the first transistor.
10. The optical sensor as set forth in claim 8, comprising:
a current source supplying the zero bias circuit with a current that does not vary depending on a voltage value of an external power supply.
11. The optical sensor as set forth in claim 10, further comprising:
a current supply circuit supplying a current to the current source when the potential difference between the two terminals decreases, the potential difference being a voltage between the two terminals.
12. The optical sensor as set forth in claim 2, comprising:
an inverter carrying out the switching control of the transistor.
13. The optical sensor as set forth in claim 12, further comprising a resistor connected between the other terminal and a gate of the transistor.
14. The optical sensor as set forth in claim 1, comprising a transistor carrying out switching between the two terminals for causing the potential difference between the two terminals, the transistor having a threshold level set at lower than 0.7 V.

15. The optical sensor as set forth in claim 14, further comprising an auxiliary transistor cascade-connected to the transistor.

16. The optical sensor as set forth in claim 2, further comprising a bias resistor for causing a switching operation of the transistor, the bias resistor having a negative thermal characteristic.

17. The optical sensor as set forth in claim 1, further comprising a switching circuit switching an amount of the current in accordance with a photocurrent amount.

18. The optical sensor as set forth in claim 1, wherein the light-receiving element has an electrode to be connected to one of the two terminals, the electrode being provided on a rear surface of a package.

19. An electronics device comprising an optical sensor as set forth in claim 1.

\* \* \* \* \*